US009024657B2

(12) United States Patent
Andreev et al.

(10) Patent No.: US 9,024,657 B2
(45) Date of Patent: May 5, 2015

(54) ARCHITECTURAL FLOORPLAN FOR A STRUCTURED ASIC MANUFACTURED ON A 28 NM CMOS PROCESS LITHOGRAPHIC NODE OR SMALLER

(71) Applicant: eASIC Corporation, Santa Clara, CA (US)

(72) Inventors: Alexander Andreev, San Jose, CA (US); Ranko L. Scepanovic, Saratoga, CA (US); Ivan Pavisic, San Jose, CA (US); Alexander Yahontov, Moscow Region (RU); Mikhail Udovikhin, Moscow Region (RU); Igor Vikhliantsev, San Jose, CA (US); Chong-Teik Lim, Penang (MY); Seow-Sung Lee, Penang (MY); Chee-Wei Kung, Penang (MY)

(73) Assignee: eASIC Corporation, Santa Clara, CA (US)

( * ) Notice: Subject to any disclaimer, the term of this patent is extended or adjusted under 35 U.S.C. 154(b) by 126 days.

(21) Appl. No.: 13/649,529

(22) Filed: Oct. 11, 2012

(65) Prior Publication Data
US 2014/0103959 A1 Apr. 17, 2014

(51) Int. Cl.
*H03K 19/177* (2006.01)
*H03K 19/0185* (2006.01)
*G06F 17/50* (2006.01)

(52) U.S. Cl.
CPC ...... *H03K 19/018585* (2013.01); *G06F 17/505* (2013.01); *H01L 2924/0002* (2013.01)

(58) Field of Classification Search
CPC ........... H03K 19/177; H03K 19/17736; G06F 17/5054
USPC ...................................... 326/37–41
See application file for complete search history.

(56) References Cited

U.S. PATENT DOCUMENTS 5,844,954 A  12/1998  Casasanta et al.
6,434,731 B1  8/2002  Brennan et al.
(Continued)

FOREIGN PATENT DOCUMENTS

DE   10 2004 022 328 A1   12/2005
EP           0793345 A1    9/1997

OTHER PUBLICATIONS

Syndicated, "Structured and Platform ASIC Architectures Mandate Custom Physical Synthesis Solutions." The Syndicated, Newsletter [online], Dec. 2005 [retrieved on Nov. 18, 2013]. Retrieved from the Internet: <URL: http://www.synopsis.com/Community/UniversityProgram/CapsuleModule/ReconfigurableSOC.pdf> pp. 10-11.

(Continued)

*Primary Examiner* — Don Le
(74) *Attorney, Agent, or Firm* — Panitch Schwarze Belisario & Nadel LLP

(57) ABSTRACT

A floorplan for a Structured ASIC chip is shown having a core region containing memory and VCLB logic cells surrounded by a plurality of IO connection fabrics that include a first IO connection fabric comprising IO sub-banks connecting the core of the chip to pins for external signals to the core, a first high-speed routing fabric disposed along the east-west vertical top of the core and connects the core to high-speed IO such as SerDes; a network-aware connection fabric connects the core to a microcontroller primarily for testing and repair of the memory in the core; and a second-high speed routing fabric is disposed on the north-south vertical sides of the core and communicates with the IO sub-banks. The VCLB Structured ASIC chip is manufactured on a 28 nm CMOS process lithographic node or smaller, having several metal layers and preferably is programmed on a single via layer.

18 Claims, 15 Drawing Sheets

(56) References Cited

U.S. PATENT DOCUMENTS

| | | |
|---|---|---|
| 7,049,873 B2 | 5/2006 | Pilo et al. |
| 7,091,890 B1 * | 8/2006 | Sasaki et al. ............... 341/100 |
| 7,132,851 B2 | 11/2006 | Young |
| 7,761,754 B1 | 7/2010 | Ang et al. |
| 7,788,614 B1 | 8/2010 | Galloway et al. |
| 7,853,632 B2 | 12/2010 | Ching et al. |
| 7,965,102 B1 * | 6/2011 | Bauer et al. ............... 326/41 |
| 8,201,126 B1 | 6/2012 | Van Dyken |
| 2003/0023914 A1 | 1/2003 | Taylor et al. |
| 2003/0142724 A1 | 7/2003 | Barth et al. |
| 2004/0007918 A1 | 1/2004 | Clevenger et al. |
| 2004/0243966 A1 | 12/2004 | Dellinger |
| 2005/0160385 A1 | 7/2005 | Coughlin |
| 2006/0017135 A1 | 1/2006 | Ogawa |
| 2006/0022705 A1 | 2/2006 | Or-Bach et al. |
| 2007/0013428 A1 | 1/2007 | Vadi et al. |
| 2007/0188188 A1 | 8/2007 | Or-Bach et al. |
| 2007/0200594 A1 * | 8/2007 | Levi et al. ............... 326/38 |
| 2008/0010626 A1 | 1/2008 | Correale |
| 2008/0309370 A1 * | 12/2008 | Spangaro ............... 326/38 |
| 2009/0065813 A1 | 3/2009 | Cox |
| 2010/0157703 A1 | 6/2010 | Fischer et al. |
| 2011/0001571 A1 | 1/2011 | Sutardja |
| 2011/0029830 A1 | 2/2011 | Miller et al. |
| 2011/0273186 A1 | 11/2011 | Karnad et al. |
| 2012/0068229 A1 | 3/2012 | Bemanian et al. |
| 2012/0085748 A1 | 4/2012 | Le Neel et al. |
| 2012/0161093 A1 | 6/2012 | Andreev et al. |
| 2012/0249200 A1 | 10/2012 | Yu |
| 2013/0095580 A1 | 4/2013 | Or-Bach et al. |
| 2014/0049932 A1 * | 2/2014 | Camarota ............... 361/807 |

OTHER PUBLICATIONS

Rittman, "28nm and below, New Path and Beyond." Jan. 13, 2011 Retrieved from the Internet: <URL: http://www.tayden.com/publications/28nm%20and%20below,%20New%20Path%20and%20Beyond.pdf>.

* cited by examiner

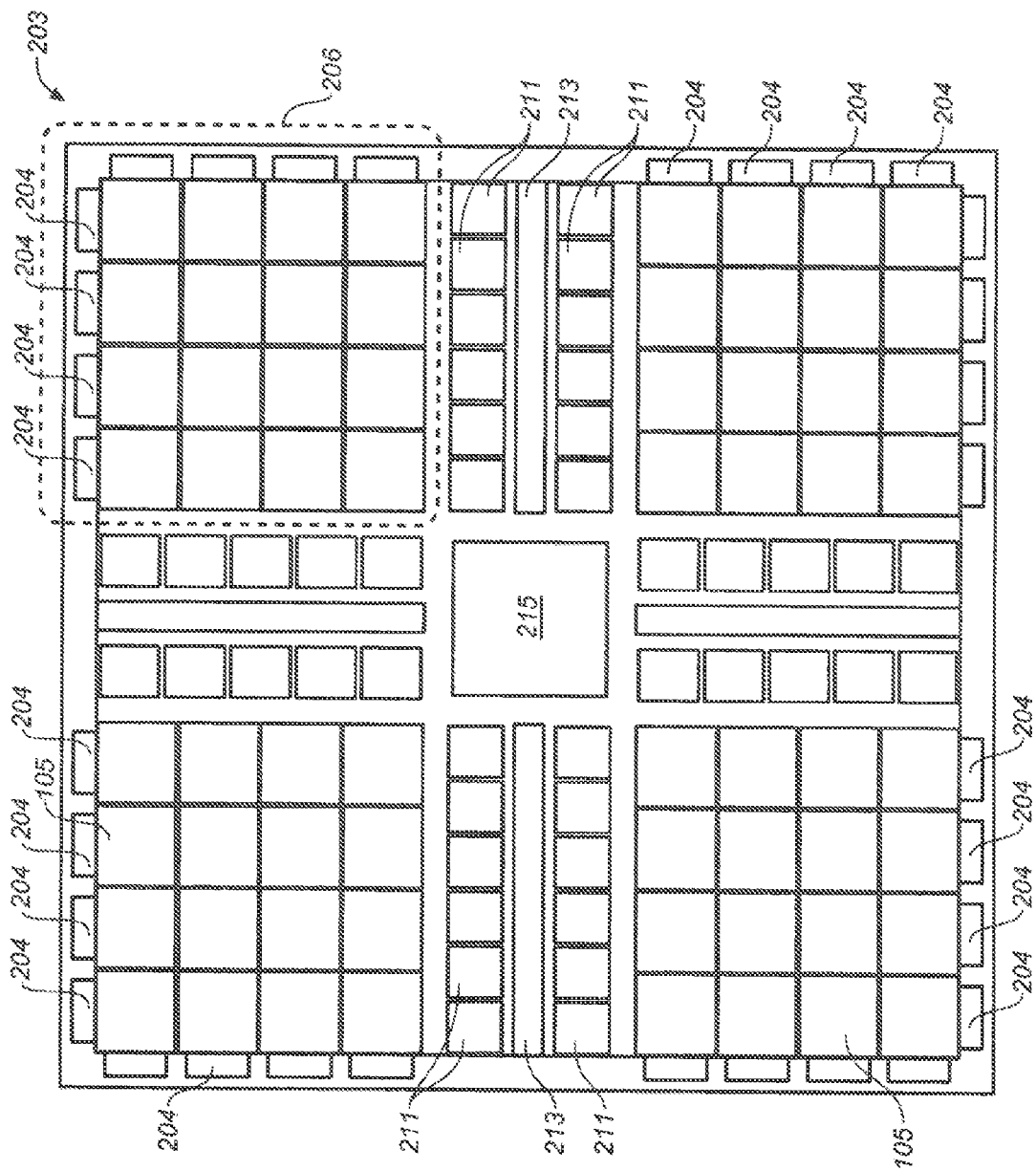

| Device | 1 | 2 | 3 | 4 | 5 | 6 |
|---|---|---|---|---|---|---|
| Area mm x mm | 20.71 = 4.80 x 4.32 | 37.71 = 6.31 x 5.98 | 57.57 = 7.82 x 7.36 | 91.45 = 9.83 x 9.30 | 124.35 = 11.34 x 10.96 | 158.71 = 12.86 x 12.34 |
| Numb ecell | 84672 | 247104 | 470592 | 886464 | 1311552 | 1774656 |
| Numb FA | 42336 | 123552 | 235296 | 443232 | 655776 | 887328 |
| Numb EDFF | 58212 | 169884 | 323532 | 609444 | 901692 | 1220076 |
| BRAM BIT | 2.3 M | 7.3 M | 14.4 M | 27.5 M | 41.0 M | 55.7 M |
| BRAM INST | 252 | 792 | 1548 | 2964 | 4416 | 6004 |
| Numb MGIO | 8 | 16 | 24 | 32 | 40 | 48 |
| Numb IO (FC 5-2-5) | 308 (350) | 444 (470) | 556 (590) | 716 (758) | 848 (898) | 960 (1018) |
| FC 3-2-3 | 263 | 380 | 476 | 613 | 726 | 822 |
| Wire Bound | 175 | 253 | 316 | 408 | 483 | 547 |

FIG. 10

ARCHITECTURAL FLOORPLAN FOR A STRUCTURED ASIC MANUFACTURED ON A 28 NM CMOS PROCESS LITHOGRAPHIC NODE OR SMALLER

CROSS-REFERENCE TO RELATED APPLICATIONS

The present application is related to: U.S. application Ser. No. 13/49,510, for "VIA-CONFIGURABLE HIGH-PERFORMANCE LOGIC BLOCK INVOLVING TRANSISTOR CHAINS" by Alexander Andreev, Sergey Gribok, Ranko Scepanovic, Phey-Chuin TAN, Chee-Wei KUNG, filed the same day as the present invention, Oct. 11, 2012; U.S. application Ser. No. 13/649,547, for "CLOCK NETWORK FISHBONE ARCHITECTURE FOR A STRUCTURED ASIC MANUFACTURED ON A 28 NM CMOS PROCESS LITHOGRAPHIC NODE" by Alexander Andreev, Andrey Nikishin, Sergey Gribok, Phey-Chuin TAN, Choon-Hun CHOO, filed the same day as the present invention, Oct. 11, 2012; U.S. application Ser. No. 13/649,551, for "MICROCONTROLLER CONTROLLED OR DIRECT MODE CONTROLLED NETWORK-FABRIC ON A STRUCTURED ASIC" by Alexander Andreev, Andrey Nikitin, Marian Serbian, Massimo Verita, filed the same day as the present invention, Oct. 11, 2012; U.S. application Ser. No. 13/649,563 for "TEMPERATURE CONTROLLED STRUCTURED ASIC MANUFACTURED ON A 28 NM CMOS PROCESS LITHOGRAPHIC NODE" by Alexander Andreev and Massimo Verita, filed the same day as the present invention, Oct. 11, 2012; U.S. application Ser. No. 13/649,584 for "DIGITALLY CONTROLLED DELAY LINE FOR A STRUCTURED ASIC HAVING A VIA CONFIGURABLE FABRIC FOR HIGH-SPEED INTERFACE" by Alexander Andreev, Sergey Gribok, Marian Serbian, Massimo Verita, Kee-Wei SIM, Kok-Hin LEW, filed the same day as the present invention, Oct. 11, 2012; and all assigned to the same Assignee as the present invention, all of which are specifically incorporated herein by reference.

BACKGROUND OF THE INVENTION

1. Field of Invention

The present invention relates generally to the field of Structured ASICs. Embodiments of the present invention relate to architecture for a Structured ASIC.

2. Description of Related Art

The present invention relates generally to an improved Structured ASIC architecture. A Structured ASIC is an ASIC (Application-Specific Integrated Circuit) having some pre-made elements that are manufactured once in a first manufacturing process and kept in inventory, then the elements are interconnected later to form a circuit, or customized by a customer, in a second manufacturing process by masks (mask-programmable) rather than making the circuit all at once as in a traditional ASIC. In a Structured ASIC the customization occurs by configuring one or more via layers between metal layers in the ASIC.

A configurable logic block (CLB) may be an element of field-programmable gate array (FPGA), structured ASIC devices, and/or other devices. CLBs may be configured, for example, to implement different random logic (from combinational logic, such as NANDs, NORs, or inverters, and/or sequential logic, such as flip-flops or latches).

Broadly defined, structured application-specific integrated circuits (ASICs) may attempt to reduce the effort, expense and risk of producing ASICs by standardizing portions of the physical implementation across multiple products. By amortizing the expensive mask layers of the device across a large set of different designs, the non-recurring engineering (NRE) for a customized ASIC seen by a particular customer, which are one-time costs that do not depend on the number of units sold, can be significantly reduced. There may be additional benefits to the standardization of some portion of mask set, which may include improved yield through higher regularity and/or reduced manufacturing time from tape-out to packaged chip.

ASICs can be broken down further into a full-custom ASIC, a Standard Cell-based ASIC (standard-cell), a Structured ASIC and a gate array ASIC. At the opposite end of an ASIC is a field-programmable gate array (FPGA), an integrated circuit designed to be configured by the customer or designer after manufacturing in the field using software commands rather than at a foundry or IC fab. Other non-ASICs include simple and complex PLDs (Programmable Logic Devices), and off-the-shelf small and medium scale IC components (SSI/MSI).

A full-custom ASIC customizes every layer in an ASIC device, which can have 10 to 15 layers, requiring in a lithography process 10 to 15 masks. Since the customized design of the ASIC occurs at the transistor level, and modern ASICs have tens if not hundreds of millions of transistors, a full-custom ASIC is typically economically feasible only for applications that required millions of units. An example of such an application is the cell phone digital modem or a flat panel television video processing device.

In a standard cell ASIC, circuits are constructed from pre-defined logic components known as cells. Designers work at the gate level, not the finer transistor level, simplifying the process. The fab manufacturing the device provides a library of basic building blocks that can be used in the cells, such as basic logic gates, combinational components (and-or-inverter, multiplexer, 1-bit full adder), and basic memory, such as D-type latch and flip-flop. A library of other function blocks such as adder, barrel shifter and random access memory (RAM) may also exist. While the layout of each cell in a standard cell is predetermined, the circuit itself has to be uniquely constructed by connecting all layers to one another and the cells within each layer in a custom manner, which takes time and effort.

A register is a standard component in an ASIC, and is a group of flip-flops that stores a bit pattern. Registers can hold information from components or hold state between iterations of a clock so that it can be accessed by other components, to allow I/O synchronization, handshaking data between clock domains, pipelining, and the like.

In a gate-array ASIC, the level of abstraction is one level higher than a standard cell, in that each building block in a gate array is from an array of predefined cells, known as a base cell, which resembles a logic gate. Since location and type of cell is predetermined, gate-array ASICs can be manufactured in advance in greater quantities and inventoried for use later. A circuit is manufactured by customizing the interconnect between these cells, which is done at the metal interconnect masks. As in gate level ASICs, typically 3 to 5 metal layers have to be customized to specify the interconnect required to complete the circuit, which simplifies the manufacturing process.

A synchronous digital system has a clock distribution network that defines a reference point for moving data within the system. A clock distribution network distributes the clock signals from a common point to all the elements in the system that need it. Generally clock signals are loaded with a great fanout, travel over comparatively great distances, and operate at the higher speeds than other signals within the synchronous system. Clock waveforms must be particularly clean and sharp. In addition, long global interconnect lines become significantly more resistive as line dimensions are decreased, and is one of the primary reasons for the increasing significance of clock distribution on synchronous performance. The control of any differences and uncertainty in the arrival times of the clock signals can limit the maximum performance of the entire system and create race conditions in which an incorrect data signal may latch within a register. The clock distribution network often takes a significant portion of the power consumed by a chip; furthermore, significant power can be wasted in transitions within blocks, when their output is not needed. Power may be saved by clock gating, which involves adding logic gates to the clock distribution tree, so portions of the tree can be turned off when not needed.

A complex field programmable device is a versatile non-ASIC, as the generic logic cells can sometimes be more sophisticated than ASIC cells, and the interconnect structure can be programmable in the field using software, rather than at a fab using for example photolithographic masks. A complex field programmable device can be re-programmed to a different circuit in hours, rather than only being programmable once at a fab like an ASIC. A complex field programmable device can be broadly divided into two categories, a Complex Programmable Logic Device (CPLD) and a Field Programmable Gate Array (FPGA). The logic cell of a CPLD can be more complex than an FPGA, and has a D-type flip-flop and a programmable logic device semiconductor such as a PAL™ type programmable logic device semiconductor, with configurable product terms. The interconnect of a CPLD is more centralized, with fewer concentrated routing lines. A FPGA logic cell is smaller, with a D-type flip-flop and a small Look Up Table (LUT), a multi input and single output block that is widely used for logic mapping, or multiplexers for routing signals through the interconnect and logic cells. The interconnect structure in an FPGA tends to be more distributed and flexible than a CPLD, making it more ideal for more high capacity, complex devices. The FPGA design that defines a circuit is stored in RAM, so when the FPGA is powered off, the design for the circuit disappears. When the FPGA is powered back up, one must reload the circuit design from non-volatile memory.

A simple PLD, historically called a programmable logic device, is much more limited in application, as they do not have a general interconnect structure. Today these devices are relatively rare by themselves and are now used as internal components in an ASIC or CPLD. Likewise, off-the-shelf small and medium scale IC components (SSI/MSI) are rarely used anymore, as they are first generation devices such as the 7400 series transistor-transistor logic (TTL) manufactured by various companies used in the 1960s and 70s to build computers. These components are no longer supported by modern EDA (Electronic Design Automation) software and have very limited functionality.

A complex field programmable device can be thought of as a form of programmable logic fabric. One such programmable logic fabric is a SRAM programmable Look-Up Table (LUT) technology that forms the basis of Field Programmable Gate Arrays and Complex Programmable Logic Devices. The programmable fabric technology allows synthesis of a logic design described in a Hardware Description Language (HDL) to be synthesized on to the logic fabric in order to perform the required logic function. The logic fabric includes memory blocks, embedded multipliers, registers and Look-Up Table logic blocks. Interconnect between logic elements is also SRAM programmable. As the state of the SRAM is deleted when powered off, the function of the programmable logic fabric incorporating SRAM can be changed.

ASIC design flow as a whole is a complex endeavor that involves many tasks, as described further herein, such as: logic synthesis, Design-for-Test (DFT) insertion, Electric Rules Check (ERC) on gate-level netlist, floorplan, die size, I/O structure, design partition, macro placement, power distribution structure, clocks distribution structure, preliminary check, (e.g., IR drop voltage drop, Electrostatic Discharge (ESD)), placement and routing, parasitic extraction and reduction (parasitic devices), Standard Delay Format (SDF) timing data generated by EDA tools, various checks including but not limited to: static timing analysis, cross-talk analysis, IR drop analysis, and electron migration analysis.

At the first step in the ASIC design flow, the design entry step, the circuit is described, as in a design specification of what the circuit is to accomplish, including functionality goals, performance constraints such as power and speed, technology constraints like physical dimensions, and fabrication technology and design techniques specific to a given IC foundry. Further in the design entry step is a behavioral description that describes at a high-level the intended functional behavior of the circuit (such as to add two numbers for an adder), without reference to hardware. Next is a RTL (Register Transfer Language) structural description which references hardware, albeit at a high-level of abstraction using registers. RTL focuses on the flow of signals between registers, with all registers updated in a synchronous circuit at the same time in a given clock cycle, which further necessitates in the design flow that the clocks be synchronized and the circuits achieve timing constraints and timing closure. RTL description captures the change in design at each clock cycle. All the registers are updated at the same time in a clock cycle for a synchronous circuit. A synchronous circuit consists of two kinds of elements: registers and combinational logic. Registers have a clock, input data, output data and an enable signal port. Every clock cycle the input data is stored internally and the output data is updated to match the internal data. Registers, often implemented as flip-flops, synchronize the circuit's operation to the edges of the circuit clock signal, and have memory. Combinational logic performs all the logical functions in the circuit and it typically consists of logic gates. RTL is expressed usually in a Verilog or VHDL Hardware Description Language (HDL), which are industry standard language descriptions. A hardware description language (HDL) is a language used to describe a digital system, for example, a network switch, a memory or a flip-flop. By using a HDL one can describe any digital hardware.

A design flow progresses from logical design steps to more physical design steps. Throughout this flow timing is of critical importance and must be constantly reassessed so that timing closure is realized throughout the circuit, since timing between circuits could change at different stages of the flow. Furthermore, the circuit must be designed to be tested for faults. The insertion of test circuitry can be done at the logic synthesis step, where register transfer level (RTL), is turned into a design implementation in terms of logic gates such as a NAND gate. Thus logic synthesis is the process of generating a structural view from the RTL design output using an optimal number of primitive gate level components (NOT, NAND, NOR, and the like) that are not tied to a particular device technology (such as 32 nm features), nor do with any information on the components' propagation delay or size. In logical synthesis the circuit can be manipulated with Boolean algebra. Logical synthesis may be divided into two-level synthesis and multilevel synthesis. Because of the large number of fan-ins for the gates (the number of inputs to a gate), two-level synthesis employs special ASIC structures known as Programmable-Logic Arrays (PLA) and modified Programmable Array Logic (PAL)-based CPLD devices. Multilevel synthesis is more efficient and flexible, as it eliminates the stringent requirements for the number of gates and fan-ins in a design, and is preferred. The multilevel synthesis implementation is realized by optimizing area and delay in a circuit. However, optimizing multilevel synthesis logic is more difficult than optimizing two-level synthesis logic, and often employs heuristic techniques.

Functional synthesis is performed at the design entry stage to check that a design implements the specified architecture. Once Functional Verification is completed, the RTL is converted into an optimized gate level netlist, using smaller building blocks, in a step called Logic Synthesis or RTL synthesis. In EDA this task is performed by third party tools. The synthesis tool takes an RTL hardware description and a standard cell library for a particular manufacturer as input and produces a gate-level netlist as output. The standard cell library is the basic building block repository for today's IC design. Constraints for timing, area, speed, testability, and power are considered. Synthesis tools attempt to meet constraints by calculating the engineering cost of various implementations. The tool then attempts to generate the best gate level implementation for a given set of constraints, target the particular manufacturing process under consideration. The resulting gate-level netlist is a completely structural description with only standard cells at the "leaves" of the design. At logical/RTL synthesis it is also verified whether the Gate Level Conversion has been correctly performed by performing simulation. The netlist is typically modified to ensure any large net in the netlist has cells of proper drive strength (fan out), which indicates how many devices a gate can drive. A driving gate can be any cell in the standard cell library. During compilation of the netlist the EDA tool many adjust the size of the gate driving each net in the netlist so that area and power is not wasted in the circuit by having too large of a drive strength. Buffer cells are inserted when a large net is broken into smaller sections by the EDA tool.

Throughout the logical design state, an EDA tool performs a computer simulation of the layout before actual physical design.

The next step in the ASIC flow is the physical Implementation of the gate level netlist, or physical design, such as system partitioning, floorplanning, placement and routing. The gate level netlist is converted into a geometric representation of the layout of the design. The layout is designed according to the design rules specified in the library for the fab that is to build the digital device. The design rules are guidelines based on the limitations of the fabrication process.

The Physical Implementation step consists of several sub steps: system partitioning, floorplanning, placement and routing. These steps relating to how the digital device is to be represented by the functional blocks, as one ASIC or several (system partitioning), how the functional blocks are to be laid out on one ASIC (floorplanning) and how the logic cells can be placed within the functional blocks (placement) and how these logic cells are to be interconnected with wiring (routing). The file produced at the output of this Physical Implementation is the so-called GDSII file, which is the file used by the foundry to fabricate the ASIC.

Floorplanning involves inputting into a floorplanning tool a netlist that describes the interconnection of ASIC blocks (RAM, ROM, ALU, cache controller, and the like); the logic cells (NAND, NOR, D flip-flop, and so on) within the blocks; and the logic cell connectors (e.g., terminals, pins, or ports). Floorplanning maps the logical description as found in the netlist to the physical description, the floorplan.

The goals of floorplanning are to arrange the ASIC blocks on the silicon chip, to decide the location of the I/O pads, to decide the location and number of the power pads, the type of power distribution, and the location and type of clock distribution. Design constraints in floorplanning include minimizing the silicon chip area and minimizing timing delay. Delay is often estimated from the total length of the interconnect and from an estimate of the total capacitance. Interconnect length and predicted interconnect capacitance is estimated from statistics of previously routed chips, including such factors as net fanout and block size of the circuits in the ASIC.

For any design to work at a specific speed, timing analysis has to be performed throughout the ASIC design flow. One must check using a Static Timing Tool in EDA whether the design is meeting the speed requirements of the specification. Industry standard Static Timing tools include Primetime (Synopsys), which verifies the timing performance of a design by checking the design for all possible timing violations caused by the physical design process.

During placement, for example, timing is effected since the length of an interconnect caused by placement changes the capacitance of the interconnect and hence changes the delay in the interconnect. The goal of an EDA placement tool is to arrange all the logic cells within the flexible blocks on a chip to achieve objectives such as: guarantee the router can complete the routing step, minimize all the critical net delays, make the chip as dense as possible, minimize power dissipation, and minimize cross talk between signals. Modern EDA placement tools use even more specific and achievable criteria than the above. The most commonly used placement objectives are one or more of the following: minimize the total estimated interconnect length, meet the timing requirements for critical nets, and minimize the interconnect congestion.

Algorithms for placement do exist, for example, the minimum rectilinear Steiner tree (MRST) is the shortest interconnect using a rectangular grid. The determination of the MRST is in general a NP-complete problem—which is difficult to solve in a reasonable time. For small numbers of terminals heuristic algorithms exist, but they are expensive in engineering cost to compute. Several approximations to the MRST exist and are used by EDA tools.

In the routing step, the wiring between the elements is planned. A Structured ASIC cross-section has metal layers; in a standard cell ASIC there may be nine metal layers, but in many structured ASICs not all metal layers need be for routing, and some layers may be pre-routed, and only the top layers are used for routing. This reduces the complexity of the manufacturing process, since non-recurring engineering costs are much lower, as photolithographic masks are required only for the fewer metal layers not for every layer, and production cycles are much shorter, as metallization is a comparatively quick process. The metal layers may be interconnected with one another at select vertical holes called vias that are filled with metal or some conductive material, called the 'via' layer, 'via connection layer' or 'via metal layer', and thus be configurable at this layer, or 'via configurable'. If the logic fabric comprising the Structured ASIC is configured with traditional IC optical lithography involving photolithographic masks, it can be thought of as "mask programmable". The mask for a Structured ASIC is programmed at the vias, and when the Structured ASIC employs via-configurable logic blocks it can be termed a via-configurable logic block (VCLB) architecture. The configuration and programmability of the VCLB architecture of the Structured ASIC may be performed by changing properties of so called "configurable vias"—connections between VCLB internal nodes. A configurable or programmable via may be in one of two possible states: it may be either enabled or disabled. If a programmable via is enabled, then it can conduct a signal (i.e., the via exists and has low resistance). If a via is disabled, then it cannot practically conduct a signal, i.e., the via has very high resistance or does not physically exist. In some designs, such as by the present assignee to this invention, eASIC Corporation, the customizable metallization layers may be reduced to a few or even a single via layer where the customization is performed, see by way of example and not limitation U.S. Pat. No. 6,953,956, issued to eASIC Corporation on Oct. 11, 2005; U.S. Pat. No. 6,476,493, issued to eASIC Corporation on Nov. 5, 2002; and U.S. Pat. No. 6,331,733, issued to eASIC Corporation on Dec. 18, 2001; all incorporated herein by reference in their entirety. Further, a single via layer could be customized without resorting to mask-based optical lithography, but with a maskless e-beam process, as taught by the '956 patent.

During circuit extraction and post layout simulation, a back-annotated netlist is used with timing information to see if the physical design has achieved the objectives of speed, power and the like specified for the design. If not, the entire ASIC design flow process is repeated. In modern EDA tools the delays calculated from a simulation library of library cells used in the design, during physical design steps, are placed in a special file called the SDF (Synopsys Delay Format) file. Each cell can have its own delay based on where in the netlist it is found, what are its neighboring cells, the load on the cell, the fan-in, and the like. Each internal path in a cell can have a different propagation time for a signal, known as a timing arc. The maximum possible clock rate is determined by the slowest logic path in the circuit, called the critical path.

Compounding the problem of delay is that in a synchronous ASIC one must avoid clock skew, and different parts of the ASIC may have different clock domains controlling them, with the wiring nets that establish the clock signal forming a clock net branching out in the form of a clock tree. Establishing this tree, which often requires additional circuitry like buffer cells to help drive the massive clock tree, is called clock tree synthesis. As an ASIC is a synchronous circuit, all the clocks in the clock tree must be in synch and chip timing control achieved, typically by using Phase-Locked Loops (PLLs) and/or Delay-Locked Loops (DLLs). If the clock signal arrives at different components at different times, there is clock skew. Clock skew can be caused by many different things, such as wire-interconnect length, temperature variations and differences in input capacitance on the clock inputs of devices using the clock. Further, timing must satisfy register setup and hold time requirements. Both data propagation delay and clock skew play important parts in these calculations. Problems of clock skew can be solved by reducing short data paths, adding delay in a data path, clock reversing and the like. Thus during the physical synthesis steps, clock synthesis is an important step, which distributes the clock network throughout the ASIC and minimizes the clock skew and delay.

Finally, IP in the form of proprietary third party functionality such as a semiconductor processor may be embedded in an ASIC using soft macros, firm macros and hard macros that can be bought from third parties. A soft macro describes the IP as RTL code and does not have timing closure given the design specification nor layout optimization for the process under consideration. However, as RTL code a soft macro can be modified by a designer with EDA tools and synthesized into the designer's library. By contrast, a hard macro is timing-guaranteed and layout-optimized for a particular design specification and process technology but is not portable outside the particular design and process under consideration, but is not represented in RTL code; rather a hard macro is tailored for a particular foundry and closer to GDSII layout. A firm macro falls between a hard macro and a soft macro. Firm macros are in netlist format, are optimized for performance/area/power using a specific fabrication technology, are more flexible and portable than hard macros, and more predictive of performance and area to be used than soft macros. Macros obviate a designer having to design every component from scratch, and are a great time saver. Third party designers favor firm and hard macros since it is easier to hide intellectual property (IP) present in such macros than it is to hide such IP in a soft macro.

Given the above, the pros and cons of standard cell ASICs versus a complex field programmable device such as an FPGA is as follows. The advantages of FPGAs are that they can be easy to design, have shorter development times and thus are faster in time-to-market, and have lower NRE costs. These are also the disadvantages of standard cell ASICs: they can be difficult to design, have longer development times, and higher NRE costs. The disadvantages of FPGAs are that design size is limited to relatively small production designs, design complexity is limited, performance is limited, power consumption is high, and there is a high cost per unit. These FPGA disadvantages are standard-cell advantages, as standard cells support large and complex designs, have high performance, low power consumption and low per-unit cost at a high volume.

A Structured ASIC falls between an FPGA and a Standard Cell-based ASIC in classification and performance. Structured ASICs are used for mid-volume level designs. In a Structured ASIC the task for the designer is to map the circuit into a fixed arrangement of known cells.

Structured ASICs are closer to standard-cells in their advantages over FPGAs. The disadvantage of structured ASICs compared to FPGAs is that FPGAs do not require any user design information during manufacturing. Therefore, FPGA parts can be manufactured in larger volumes and can exist in larger inventories. This allows the latency of getting parts to customers in the right volumes to be reduced. FPGAs can also be modified after their initial configuration, which means that design bugs can be removed without requiring a fabrication cycle. Design improvements can be made in the field, and even done remotely, which removes the requirement of a technician to physically interact with the system.

Given these pros and cons, structured ASICs combine the best features of FPGAs and standard cell ASICS. Structured ASIC advantages over standard cell ASICs and FPGAs include that they are largely prefabricated, with components are that are almost connected in a variety of predefined configurations and ready to be customized into any one of these configurations. Fewer metal layers are needed for fabrication of a Structured ASIC, which dramatically reduces the turn-around time. Structured ASICs are easier and faster to design than standard cell ASICs. Multiple global and local clocks are prefabricated in a Structured ASIC. Consequently, there are no skew problems that need to be addressed by the ASIC designer. Thus signal integrity and timing issues are inherently addressed, making design of a circuit simpler and faster. Capacity, performance, and power consumption in a Structured ASIC is closer to that of a standard cell ASIC. Further, structured ASICs have faster design time, reduced NRE costs, and quicker turnaround than standard cell ASICs. Thus with structured ASICs the per-unit cost is reasonable for several hundreds to 100 k unit production runs.

A technology comparison between standard cell ASICs, structured ASICs, and FPGAs, respectively, is roughly as follows: generally speaking, and these ratios can change year-by-year and with different process lithographic nodes, there is a ratio of 100:33:1 between the number of gates in a given area for standard cell ASICs, structured ASICs, and FPGAs, respectively; a ratio of 100:75:15 for performance (based on clock frequency); and a ratio of 1:3:12 for power.

Compared to a field-programmable gate array (FPGA), the unit price of a Structured ASIC solution may be reduced by an order of magnitude due to the removal of the storage and logic required for configuration storage and implementation. The unit cost of a Structured ASIC may be somewhat higher than a full custom ASIC, primarily due to the imperfect fit between design requirements and a standardized base layer, with certain I/O, memory and logic capacities.

An ideal ASIC device may combine the field programmability of FPGAs with the power and size efficiency of ASICs or structured ASICs.

A system-on-chip (SoC) is an integrated circuit that implements many or all of the functions of a complete electronic system. The components of a SoC vary with the application. Some SoCs contain mixed signal and analog input/output (IO), but usually most of a SoC is digital. The SoC may contain memory, CPUs (central processing units)/microprocessors, busses, specialized logic and other digital functions. The architecture of the SoC is tailored to an application rather than being general-purpose.

A System-in-Package (SiP) are multiple bare dice and/or chip-scale package (CSP) devices, each implementing their own function (e.g., analog, digital, and radio frequency (RF) dice) that are mounted on a SiP common substrate, which is used to connect them together. The substrate and its components are then placed in (or built into) a single package, called a IC (Integrated Circuit) or SiP, which is a traditional two-dimensional (2D) chip. A 2.5D IC/SiP is different from a traditional 2D IC/SiP, and in one type of 2.5D IC a silicon interposer is placed between the SiP common substrate and the dice, where this silicon interposer has through-silicon vias connecting the metallization layers on the upper and lower surfaces of the silicon interposer. The multiple bare dice can be attached to the silicon interposer using micro-bumps, which are about ~10 um in diameter, and in turn the silicon interposer is attached to the SiP substrate using regular flip-chip bumps, which can be ~100 um in diameter. Further, a 3D IC/SiP configuration enable designers to achieve higher levels of integration by allowing multiple die to be stacked vertically on top of one another. Wire bonds connect a topmost die with an underlying SiP substrate and allow the topmost die to communicate with a SiP substrate that is covered by an underlying die.

A FET (Field Effect Transistor) is a transistor that uses an electric field to control the conductivity of a charge carrier channel in a semiconductor. A common type of FET is the Metal Oxide Semiconductor FET (MOSFET). MOSFET work by inducing a conducting channel between two contacts called the source and the drain by applying a voltage on the oxide-insulated gate electrode. Two types of MOSFET are called nMOSFET (commonly known as nMOS or NFET) and pMOSFET (commonly known as pMOS or PFET) depending on the type of carriers flowing through the channel. A nMOS transistor is made up of n-type source and drain and a p-type substrate. The three modes of operation in a nMOS are called the cut-off, triode and saturation. nMOS logic is easy to design and manufacture, but devices made of nMOS logic gates dissipate static power when the circuit is idling, since DC current flows through the logic gate when the output is low. By contrast, a pMOS transistor is made up of p-type source and drain and a n-type substrate. pMOS technology is low cost and has a good noise immunity. In a nMOS, carriers are electrons, while in a pMOS, carriers are holes; since electrons travel faster than holes, all things being equal NFETs are twice as fast as PFETs. When a high voltage is applied to the gate, with the gate-source voltage exceeding some threshold value ($V_{GS} > V_{TH}$), the nMOS will conduct, while pMOS will not; and conversely when a low voltage is applied in the gate, nMOS will not conduct and pMOS will conduct. PFETs are normally closed switches and NFETs are normally open switches. PFETs often occupy more silicon area than NFETs when forming logic blocks. pMOS devices are more immune to noise than nMOS devices. Furthermore, nMOS ICs are smaller than pMOS ICs with the same functionality, since the nMOS can provide one-half of the impedance provided by a pMOS under the same geometry and operating conditions.

Complementary metal-oxide-semiconductor (CMOS) is a technology for constructing integrated circuits. CMOS is sometimes referred to as complementary-symmetry metal-oxide-semiconductor (or COS-MOS). The words "complementary-symmetry" refer to the fact that the typical digital design style with CMOS uses complementary and symmetrical pairs of p-type and n-type metal oxide semiconductor field effect transistors (MOSFETs) for logic functions. Complementary Metal-Oxide-Silicon circuits require an nMOS and pMOS transistor technology on the same substrate. An n-type well is provided in the p-type substrate. Alternatively one can use a p-well or both an n-type and p-type well in a low-doped substrate. The gate oxide, poly-silicon gate and source-drain contact metal are typically shared between the pMOS and nMOS technology, while the source-drain implants are done separately. Since CMOS circuits contain pMOS devices, which are affected by the lower hole mobility, CMOS circuits are not faster than their all-nMOS counter parts. Even when scaling the size of the pMOS devices so that they provide the same current, the larger pMOS device has a higher capacitance.

The CMOS advantage is that the output of a CMOS inverter can be as high as the power supply voltage and as low as ground. This large voltage swing and the steep transition between logic levels yield large operation margins and therefore also a high circuit yield. In addition, there is no power dissipation in either logic state. Instead the power dissipation occurs only when a transition is made between logic states. CMOS circuits are therefore not faster than nMOS circuits but are more suited for very/ultra large-scale integration (VLSI/ULSI).

What is desired is a floorplan for a Structured ASIC that is scalable and has a plurality of IO connection fabrics in a via-configurable logic block (VCLB) architecture.

SUMMARY OF THE INVENTION

Accordingly, an aspect of the present invention is to provide a floorplan for a Structured ASIC, manufactured using a CMOS process using NFET/nMOS and PFET/pMOS transistors, which includes a via-configurable logic block (VCLB) architecture. VCLB configuration may be performed by changing properties of so-called "configurable vias"—connections between VCLB internal nodes and elements in a Structured ASIC.

An aspect of the present invention is to provide an architectural floorplan suitable for building a system-on-chip (SoC).

Another aspect of the present invention is to provide a core containing memory cells and a novel configuration logic cell array that is connected to Input/Output (IO) of three types, a first IO routing fabric running on the left and right sides (running north/south or vertical) of the core and a second, high-speed IO routing fabric that may extending around the entire boundary of the core that communicates with a high-speed SerDes, with the second, high-speed IO routing fabric having a faster data transfer rate than the data transfer rate of the first IO fabric, and a third "network-aware" IO that works with a microcontroller to test and repair memory in the core, and another high-speed IO routing fabric extending along the north-south sides of the core.

Another aspect of the present invention is to provide a type of VCLB Structured ASIC that may use IO, memory, and logic blocks in a novel manner.

Another aspect of the present invention is to provide a type of VCLB Structured ASIC as described herein that is manufactured on a 28 nm CMOS process lithographic node or smaller.

Yet another aspect of the present invention is to provide via-configurable metal layers for the customization of the semiconductor device described herein to be customized in a single via layer.

The sum total of all of the above advantages, as well as the numerous other advantages disclosed and inherent from the invention described herein, creates an improvement over prior techniques.

The above described and many other features and attendant advantages of the present invention will become apparent from a consideration of the following detailed description when considered in conjunction with the accompanying drawings.

BRIEF DESCRIPTION OF THE DRAWINGS

Detailed description of preferred embodiments of the invention will be made with reference to the accompanying drawings. Disclosed herein is a detailed description of the best presently known mode of carrying out the invention. This description is not to be taken in a limiting sense, but is made merely for the purpose of illustrating the general principles of the invention. The section titles and overall organization of the present detailed description are for the purpose of convenience only and are not intended to limit the present invention.

FIG. 3B is a detailed view of the schematic of FIG. 3A of a single core logic block of the Structured ASIC of the present invention.

FIG. 10 is a table of the parameters of the various components for several embodiments of the Structured ASIC of the present invention.

Figure 1:
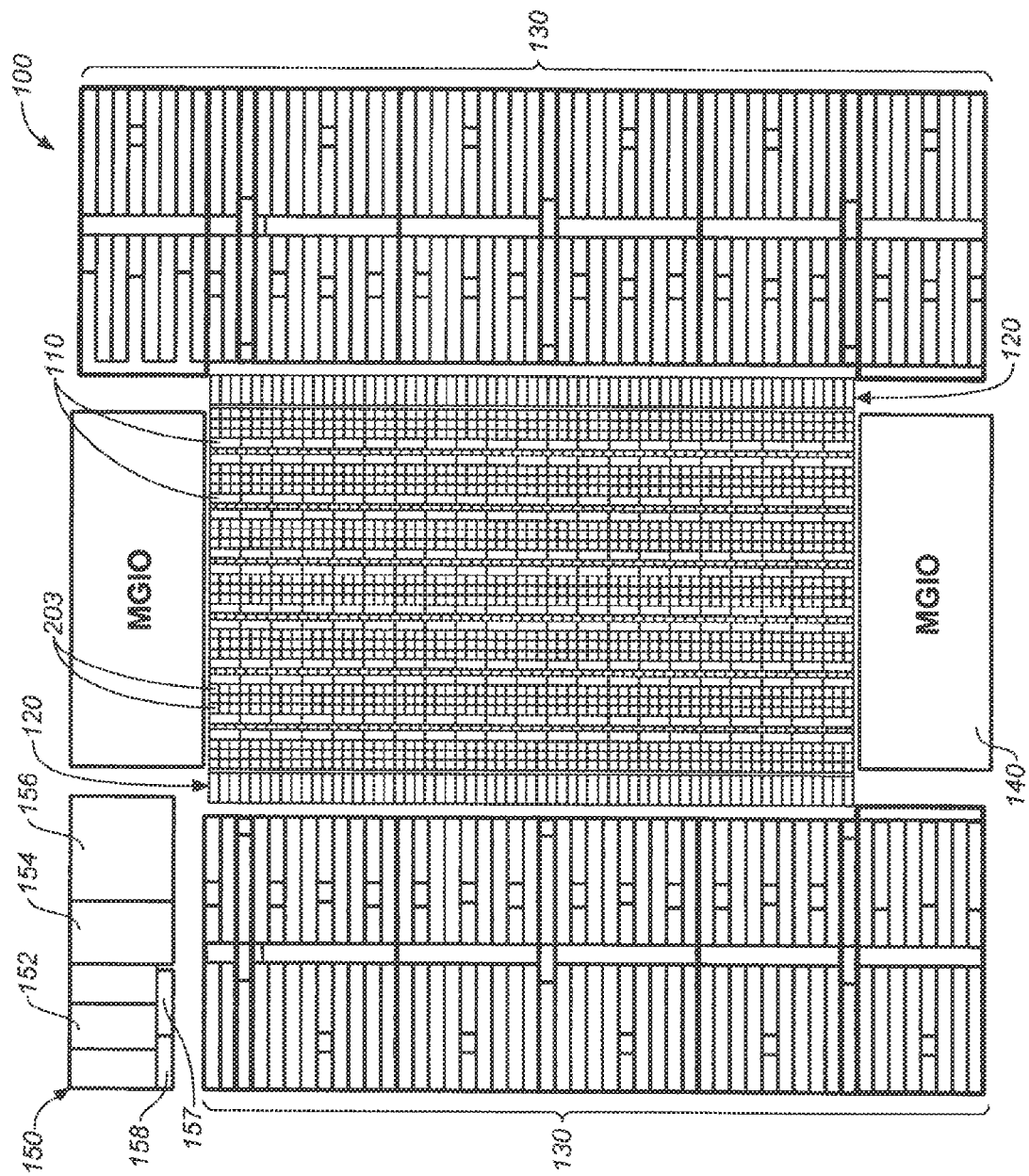
FIG. 1 is a schematic of the generalized floor plan architecture of the Structured ASIC of the present invention.

It should be understood that one skilled in the art may, using the teachings of the present invention, vary embodiments shown in the drawings without departing from the spirit of the invention herein. In the figures, elements with like numbered reference numbers in different figures indicate the presence of previously defined identical elements.

DETAILED DESCRIPTION OF THE INVENTION

The method and apparatus of the present invention may be described in software, such as the representation of the invention in an EDA tool, or realized in hardwire, such as the actual physical instantiation.

Regarding the floorplan of the present invention, the drawings sometimes show elements as blocks that in a physical implementation may differ from this stylized representation, but the essential features of the floorplan should be apparent to one of ordinary skill in the art from the teachings herein.

The elements in the floor plan of the present invention are operatively connected to one another where necessary, as can be appreciated by one of ordinary skill in the art from the teachings herein.

According to an embodiment of the invention, there in shown in FIGS. 1 and 2, not to scale, a generalized floor plan architecture of the Structured ASIC chip 100, code-named the RUBY architecture, a Structured ASIC having some pre-made elements that are mask-programmable or customized later by a customer rather than all at once as in a traditional ASIC, with the customization occurring by configuring via-configurable metal layers, preferably using just a single via layer. The Structured ASIC has logic unit block module array 203 that contain, inter alia, transistor based, via-programmable, via-configurable logic block (VCLB) or logic cells 105 for building any sort of random logic, sequential circuit or combinational circuit, and memory cells 110. The memory is comprised of BRAM (Block RAM) in 512 kb×18 bits (with an extra bit for repair). The logic cell modules 203 and the memory blocks 110 together comprising the logic and memory core 115 of chip 100. The logic and memory alternate in a repeating pattern of vertically extending columns throughout the substantially rectilinear and rectangle shaped core 115 as shown in FIG. 1, with the columns aligned along a vertical, north-south axis or direction in the core, and repeating to form a scalable architecture. There is an IO region 130 on the left and right sides of the chip 100, servicing the core 115 comprising the logic cell modules 203 and the memory cells 110, as will be explained further herein, and extending vertically north-south along the core 115 as shown. The IO fabric area comprises an IO sub-bank 130 extends to the left (west) and right (east) of the chip 100. The IO sub-bank 130 extends to the left and right of the chip 100 and is operatively connected to an IO region 120 intermediate it and the core 115. In a preferred embodiment the area taken up by the total IO area, the memory and the logic each comprise roughly 30% of the total chip 100 area layout. BIST (Built-In Self Test) circuitry 125 exists in the IO area. The BIST fabric 125 is for test and global connections and is three cells wide. Within the core 115 there is additional routing to connect the logic blocks 203 and memory cells 110 as need be, operatively connected to the IO circuitry at the periphery of the core 115.

Figure 5A:
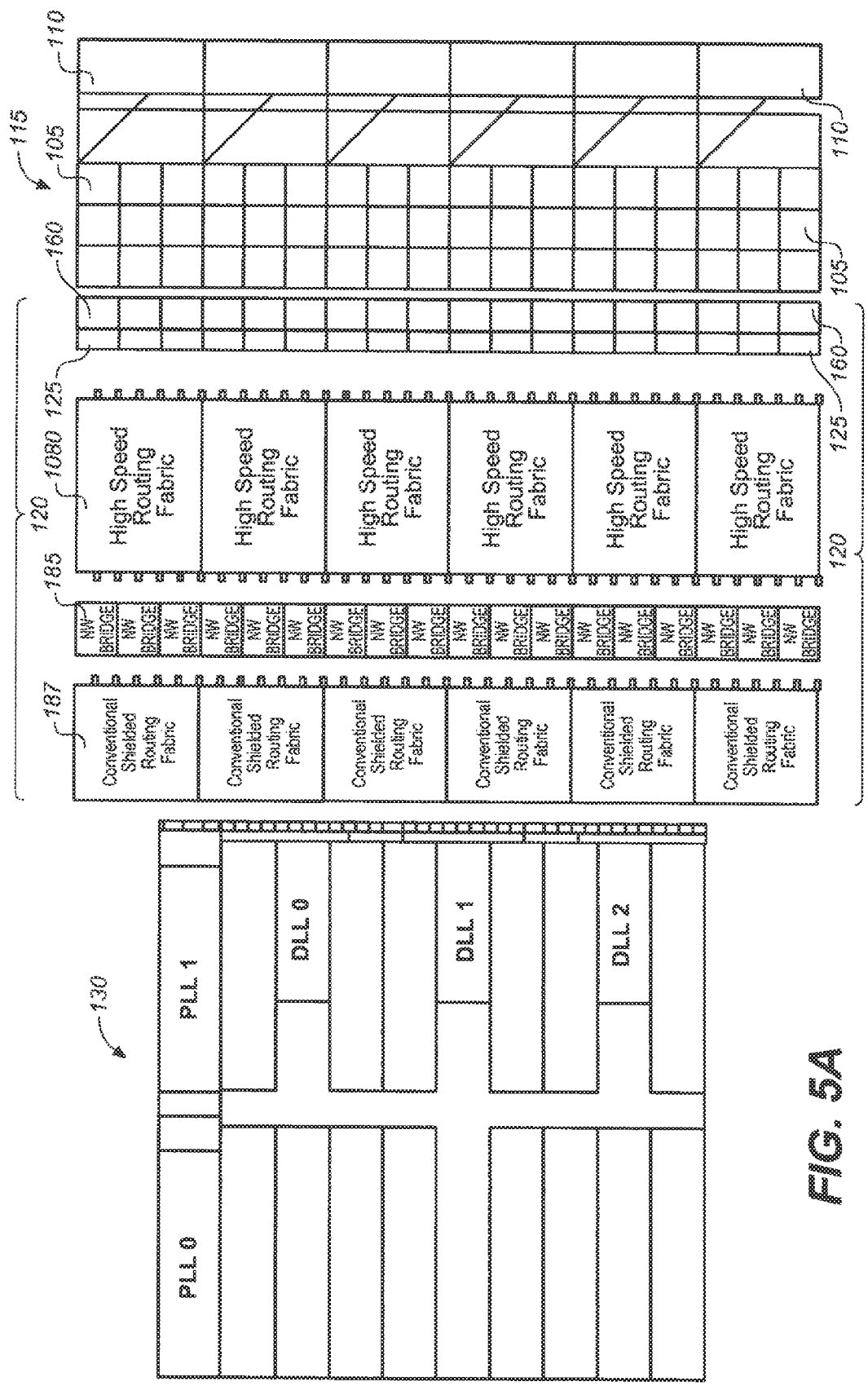
FIG. 5A is a first schematic of the boundary routing fabric for the Structured ASIC of the present invention.
Figure 5B:
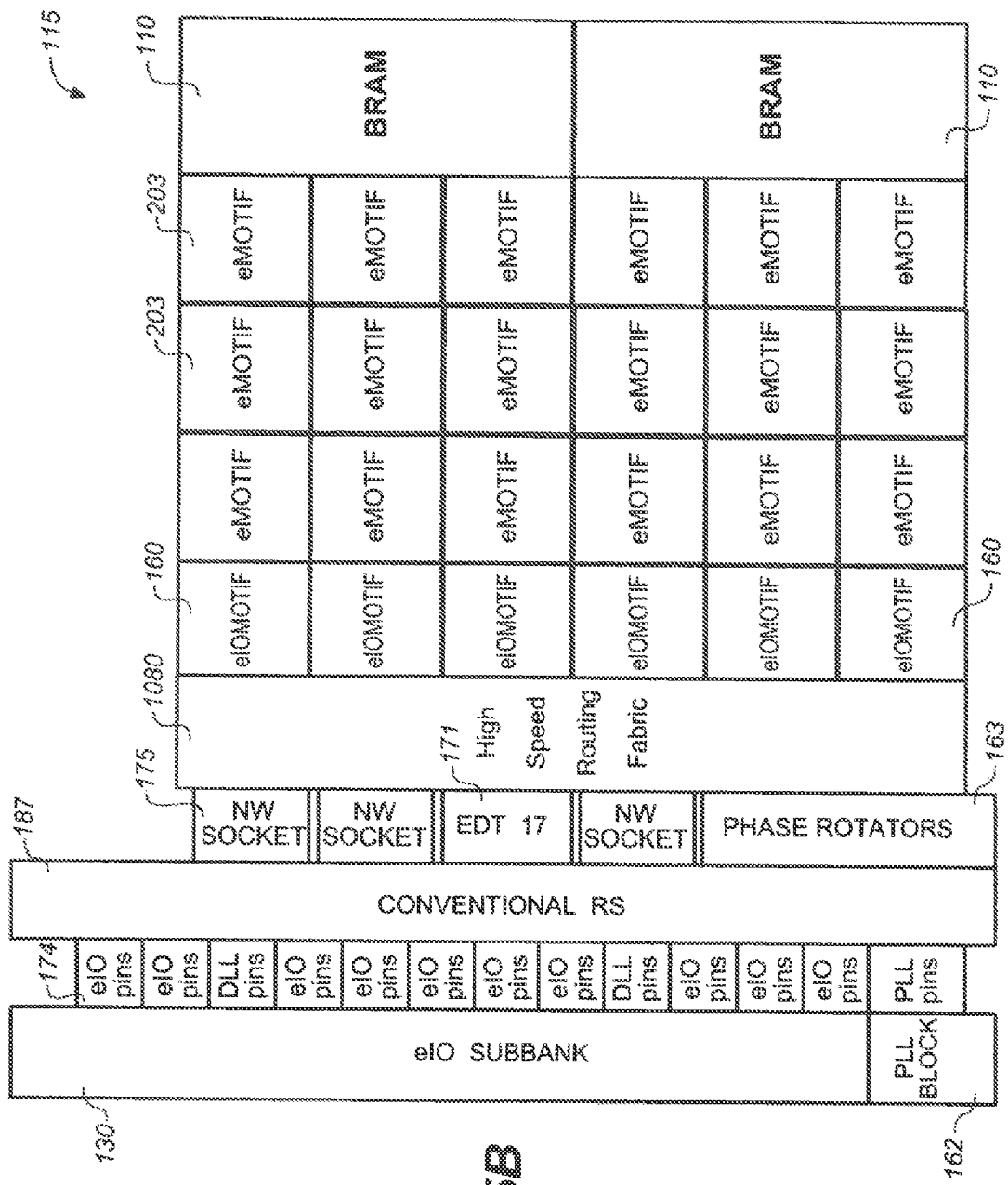
FIG. 5B is a second schematic of the boundary routing fabric for the Structured ASIC of the present invention.
Figure 6:
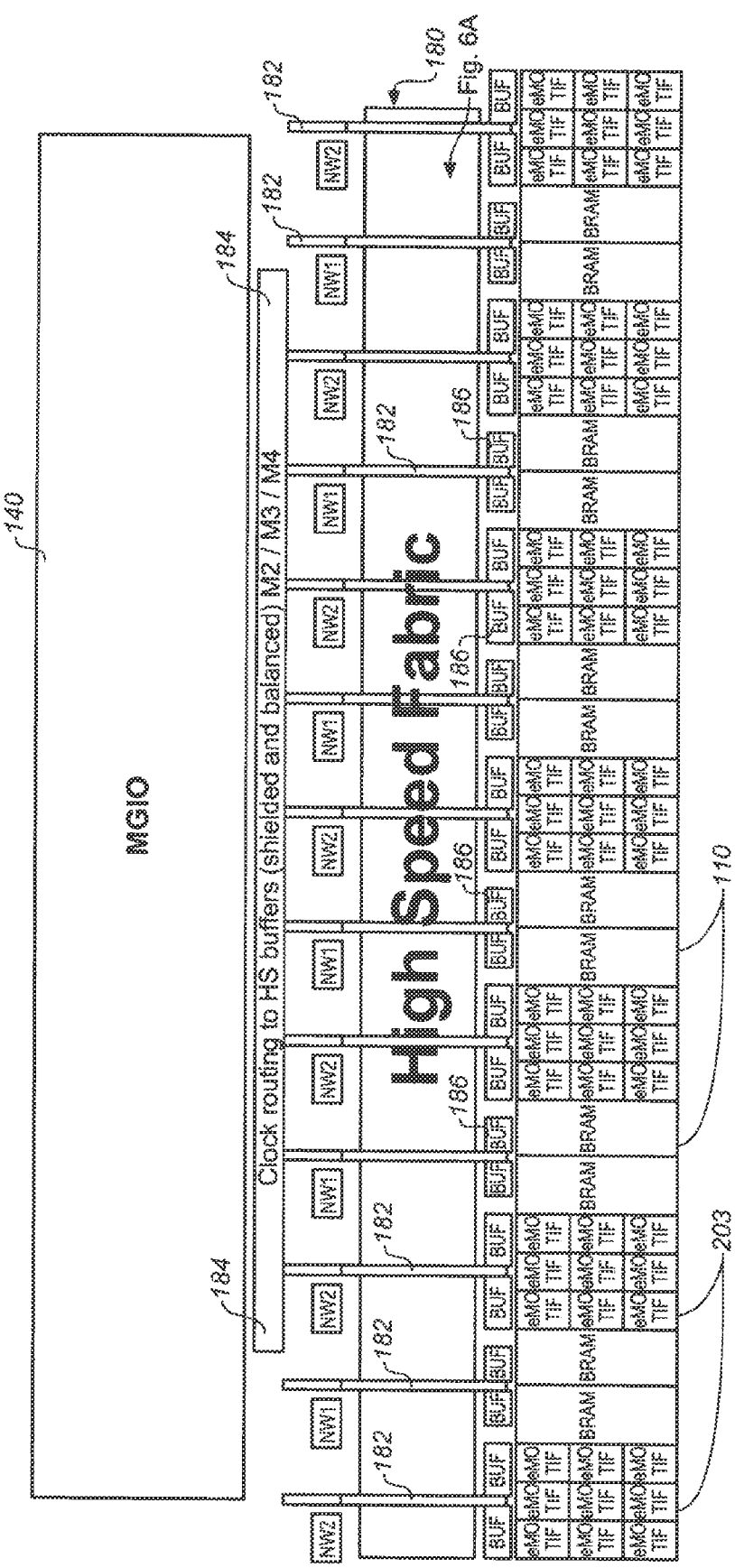
FIG. 6 is a schematic of the high-speed routing fabric of the present invention.

As shown in the figures, in particular FIGS. 1 and 2 and FIGS. 5A, 6, the core 115, which contains logic, is surrounded by IO (Input/Output) of a first IO routing fabric, having a plurality of IOs comprising IO sub-bank 130 comprised of a plurality of IOs termed eIOs as explained further herein, each extending horizontally but collectively running on the left and right sides (north/south or vertical) of the core 115. This first IO routing fabric 130 is slower than a second, high-speed IO routing fabric 180 having a faster data transfer rate, as explained further herein in connection with fabric 180 as shown in FIGS. 5A, 5B, 6, and the like. The first IO fabric is sub-bank 130, which has four sub-banks 132, 134, 136, 138 on the left side of the Structured ASIC in FIG. 3 and five sub-banks 131, 133, 135, 137, 139 on the right side. This first IO fabric is typically used to communicate with the outside world by interfacing with the mechanical pins and package interface used with semiconductor chips. A boundary routing region 160, called eIOMOTIF boundary region, communicates between the core 115 and the first IO fabric. EIOMOTIF can be used to implement timing critical parts of high-speed IO-interfaces. The eIOMOTIF boundary region 160 actually can be part of the core 115, and can contain logic to configure the first IO fabric.

The second routing fabric 180 is used to connect high-speed IO, such as eASIC Multi-Gigabit IO (MGIO) block(s) 140 found at the top of the core 115 aligned along the east-west direction, with the core 115. The MGIO blocks 140 are used for high-speed data transfer as SerDes (a serializer/deserializer integrated circuit transceiver that converts parallel data to serial data and vice-versa). In a preferred embodiment four MGIO blocks 141, 142, 144, 146 contain a PLL inside (not shown), and are preferably spaced at the top and bottom of the core 115. The MGIO blocks 140 that support data rates in excess of 6.5 Gbps and up to 14 Gbps or greater.

Thus the present invention has a first, IO routing fabric running on the left and right sides (north-south, vertically extending along the chip 100) of the core 115 and a second, high-speed IO routing fabric communicating with the MGIO SerDes, running on the top and bottom sides as well as left and right sides, with the second, high-speed IO routing fabric having a faster data transfer rate than the data transfer rate of the first IO fabric. This second routing fabric 180 may be operatively connected to the clock network of the chip 100 as well.

A third routing network is for testing. As shown in FIGS. 1 and 2 in the upper left hand corner there is a corner macro 150 that contains a microcontroller or microprocessor block 152 for the Structured ASIC that acts to control, inter alia, JTAG (boundary scan test) logic via a test routing fabric as explained further herein. The 32 bit microcontroller block 152 is used for a plurality of functions including but not limited to testing of memory and logic, including BIST (Built-In Self Test) testing, and fuse/anti-fuse support for any logic that supports this functionality, such as eFuse block 154, addressing memory, such as memory blocks/cells 110, and initialization and configuration of the chip 100. The microcontroller block 152 may also, on-the-fly, configure IP in core 115, through the fabric in the core 115 and/or through JTAG (e.g., IEEE 1149.1 Standard Test Access Port and Boundary-Scan Architecture) ports. The microcontroller 152 can set up test paths inside the chip for BIST and/or scan-chain testing for testing memory and/or logic in core 115, in conjunction with test circuitry. The microcontroller can also set impedance dynamically and digitally in the SerDes of the present invention, as well as any dynamically configurable IO components, through access to a delay tap and perform other such customization of the Structured ASIC through access to a test routing fabric, a network path that may run along the north/south border of the core 115, as well as through network agents found at the top of the core 115, such as NW1, NW2, and other network aware intelligent agents for routing test signals, operatively connected to one another and forming together a test routing fabric network for testing, primary the memory 110 in the chip 100 but also testing any logic 203. It should be noted that in lieu of a microcontroller 152 directing the testing, an external tester can be operatively connected to the test routing fabric for testing of the core.

The test routing fabric primarily is concern with the testing and repair of memory cells in the chip 100, with the microcontroller 152 selecting which memory cells 110 are to be tested and/or repaired. This is done in a "network" fashion, by the processor in the microcontroller setting up paths through which data may be transferred using a bus or data pathway forming a microcontroller network.

Also aligned along the north-south (vertical) direction between logic blocks 203 and memory cells 110 in the core region 115, and the IO sub-banks 130, is the routing fabric 160 called the eIOMOTIF boundary region 160 The routing fabric for eIOMOTIF boundary region may reside on predefined metal layers 6, 7 and 8 (M6/M7/M8), separate from the other planes comprising the chip 100 (as stated, the elements of the Ruby invention may reside in parallel planes but do not necessarily have to all reside on a single plane). All of these first, second and test routing fabrics can be operatively connected to one another and to the core 115 by a Structured ASIC designer as needed according to the designers whim, though generally they are preconfigured as described herein.

Third routing fabric comprising the network aware IO fabric has network aware blocks such as bridge blocks "NW1" (providing access to logic cells) and "NW2" (providing access to memory cells) under the direction of the processor are also present at the top of the chip, along an east-west (horizontal) direction, as well as suitable connections and logic (not shown) along a north-south direction. The network-aware connection fabric comprises, inter alia, bridge blocks NW1 and NW2 which are instructed by the microcontroller 152 (which controls their state, and controls how and in which direction the network aware cells will pass data) to pass or not pass data (e.g. instructions) and act in a bus and/or pipeline and/or hybrid bus/pipeline network manner, to establish a circuit path to and from the processor block and/or an external signal from an external tester outside the chip, and the BRAM memory 110 or logic blocks 203 that are being tested. Blocks in the network-aware IO cells 160, such as shown in "NW1", "NW2" in FIG. 6, once they are configured by the processor, are able to direct any data, such as instruction data or test data, to and from the microcontroller and the logic blocks 203 and/or memory cells 110 of the core 115. The data circulate around the testing IO fabric, along data pathways set up by the microcontroller using intelligent bridges and logic such as bridge block bridges "NW1" and "NW2" in FIG. 6; and the data are directed to a specific memory cell of memory 110 or circuitry connected to logic block 203, as the case may be. In general, as can be best seen in FIG. 6, bridge block NW1, present along the top of chip 100 core 115, directs data to the top of BRAM memory column cells 110, while bridge block NW2 (which is present along the horizontal top of chip 100, in FIG. 6) directs data from the microcontroller and/or outside world to and from the logic modules 203 (eMotif modules). Hence the testing IO network-aware connection fabric acts as an intelligent agent in routing data, primarily test data for testing the memory cells 110 of the chip 100.

Memory cells 110 may also be repaired by the microcontroller 152, if the microcontroller determines the memory is defective during test, since each memory has a redundant bit for repair in case one bit on a memory cell is defective. Muxes on the memory will render operable the redundant bit to repair the defective bit if a defect is found. The microcontroller can also be run in debug mode to query each memory one at a time. Typically this testing of memory is done by the microcontroller upon bootup, power on or start of the Structured ASIC.

The eFUSE (electronic fuses that can be blow electrically) block 154 in FIG. 1 can store what memories need repair so that the processor can repair these memories upon powering up or Power On Reset (POR), which is controlled by Master POR block 157. Chip ID and production and process specific information can also be stored in the eFUSE block 154.

A Master Power On Reset (POR) block 157 controls what sequence of events occurs when the Structured ASIC is power cycled on. A VIAROM block (2 MB memory) 156 records data and is via-configurable ROM, so by setting certain vias one can program the ROM with data. Block eio_bgref 158 may set the reference voltage for the Structured ASIC chip.

Figure 3A:
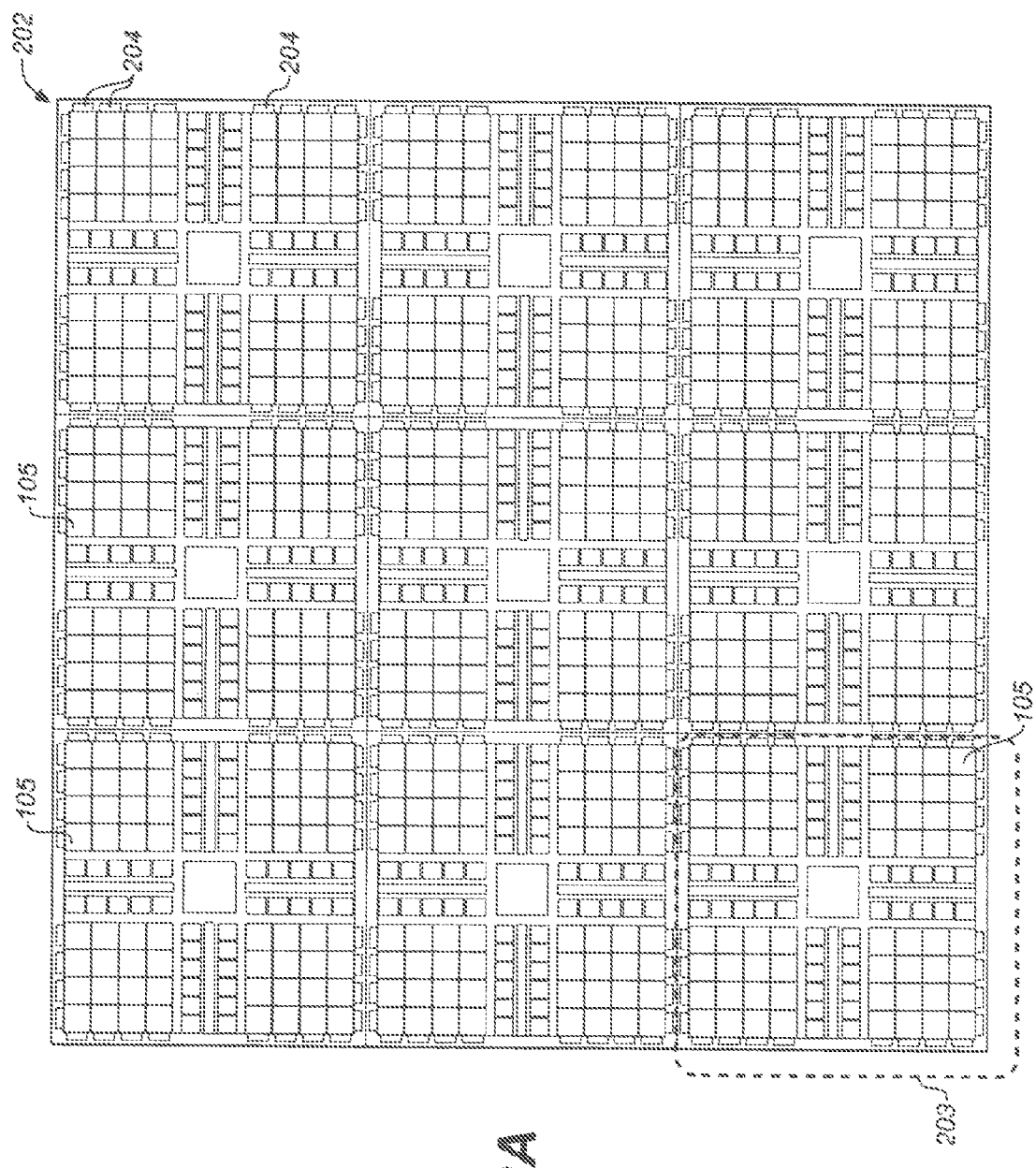
FIG. 3A is a schematic of the core logic blocks in a three-by-three configuration in the Structured ASIC of the present invention.

FIG. 3A is an enlarged schematic of the logic blocks floorplan involving logic cell modules 203 (termed eMotif) and logic cells 105 (termed eCELLs) in FIG. 1; FIG. 3B is an enlarged portion of the eMotif 203 in FIG. 3A. FIG. 3A is a schematic of the core logic blocks in a three-by-three configuration in the Structured ASIC of the present invention and comprises a titled three-by-three pattern of eMotif 203 logic blocks, the 3-by-3 block 202, which forms a repeating pattern of nine blocks of eMotif module cells 203 as shown. Each block within the three-by-three block 202 is an eMotif eCELL Matrix 203 or eCELL module array 203, which has 64 (4×4×4) logic cells 105 (eCELLs), that are tiled in a four-by-four pattern in four blocks 206, as shown, in each corner of the eMotif eCELL Matrix 203, for a total of 64 logic cells 105 in Matrix 203, as shown by FIG. 3B. Thus FIG. 3B is an expanded view of the eMotif eCELL Matrix 203. Each generally square shaped logic cell 105 (eCELL) in eMotif eCELL Matrix 203 has customizable logic, such as a via-configurable logic block (VCLB), or any other type of mask-programmable logic or logic, using transistors that are connected to one another, often by vias, and the vias can configurable by a user or customer of the Structured ASIC chip 100. In FIG. 3B, eight full adders 204 surround each four-by-four block 206 of tiled pattern logic block cells 105 of the eMotif eCELL Matrix 203 from the outside. There are 32 full adders 204 for each eMotif eCELL Matrix 203, as shown. Full adders are often used in addition and complex multiplication of the kind performed by communications ASICs and in multiplexers. In another embodiment the full adders 204 can be embedded inside the cells 105 rather than outside as shown. While in one embodiment, as shown, there are 32 full adders 204 for each eMotif eCELL Matrix 203, in another embodiment (not shown), there are 16 full adders for each eMotif sub-block 206, giving 64 full adders.

The contents of the cell modules 105 in eMotif eCELL Matrix 203 may be any kind of logic, or configurable logic block (CLB); in general the cells 105 comprise transistor based logic. Furthermore these cell modules 105 may be made of FET transistors manufactured by a CMOS process in the 28 nm or smaller lithographic node.

The Structured ASIC chip 100 of the present invention may have any number of metal layers for signal and power, and in one embodiment has eight signal metal layers (M1-M8, with one of those eight layers being customizable or via configurable by the customer of the Structured ASIC, and in a preferred embodiment being the via layer between M3/M4, and the other metal layers being fixed prior to customization by the customer), and three metal layers M9/M10/M11 for power distribution.

As shown in FIG. 3B, conventional flip-flops 211, such as D-flip-flops, are present in eMotif 203 and can be used in registers and to hold state information; in general any type flip-flops may be used. An optional external to the logic cells 105 routing buffer 213, that may also be incorporated into the individual logic cells 105 of the eMotif eCELL Matrix 203 itself, is for buffering routing paths in the eMotif eCELL Matrix 203. A clock macro 215 in the center of the eMotif eCELL Matrix 203 has routing buffers 213 for efficiently distributing clock signals to the eCELL Matrix 203 components, the clock signals comprising one or more clock signals received from clock trees throughout the chip as well as providing a local clock signal for the eMotif eCELL Matrix 203. The buffers 213 and D-flip-flops 211 form a distinctive cross shape in the Matrix 203, centered about the clock macro 215, which is centered in the middle of the eMotif module 203. Suitable connecting traces and fabric (not shown) connect the blocks shown in eMotif module 203.

Figure 4:
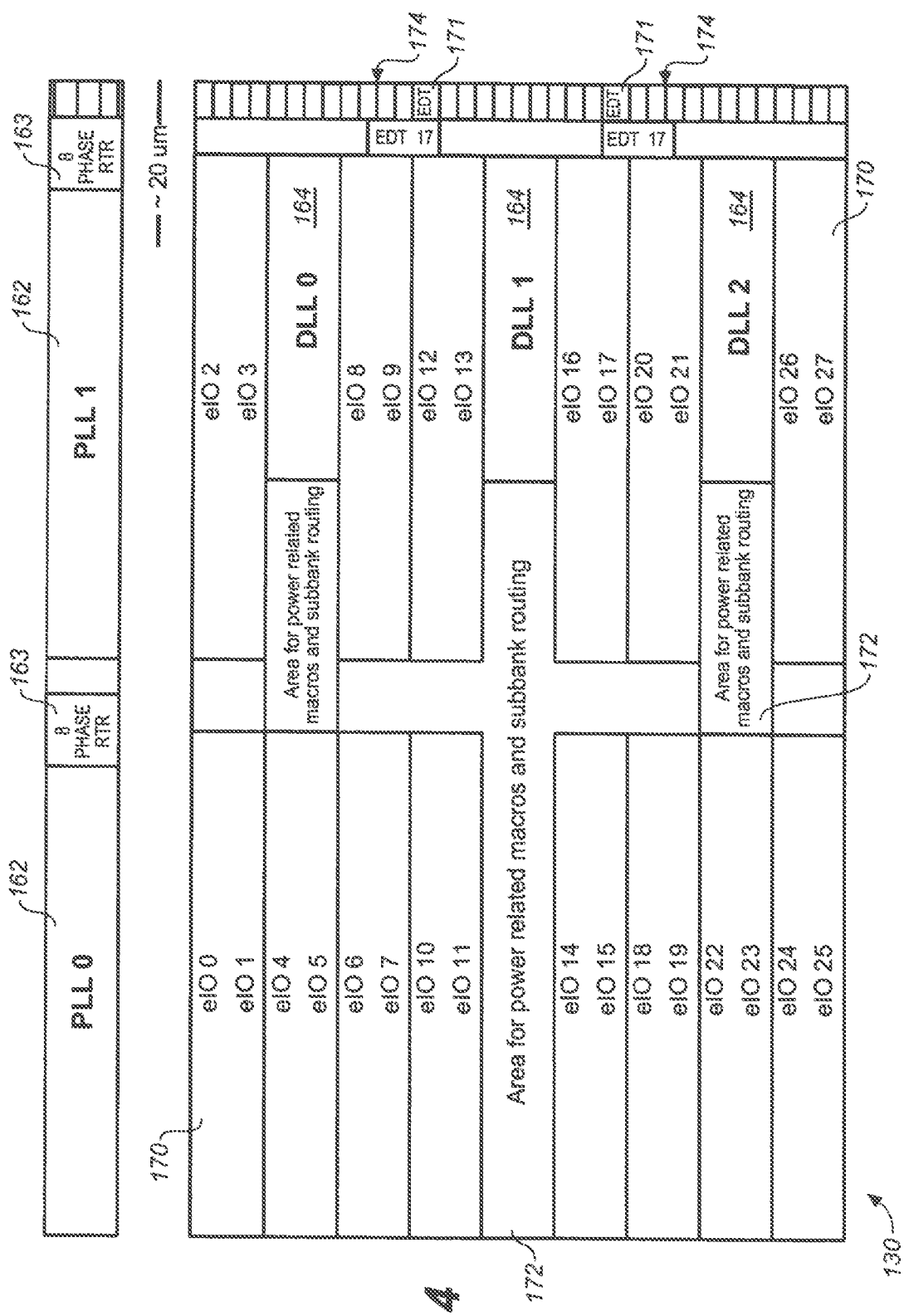
FIG. 4 is a schematic of the sub-bank layout for an IO comprising the first IO routing fabric, shown in more detail than in FIG. 1.

FIG. 4 is a schematic of the layout for the power related macros, sub-bank floorplan routing section of the first routing fabric comprising the IO region 130 of the Structured ASIC chip 100 of the present invention, shown in more detail than in FIG. 1. PLL/DLL blocks such as PLLs 162 and DLLs 164 and the like shown in FIG. 4. PLLs 162 may receive a clock signal from an outside source such as a piezoelectric crystal, and increase its frequency so it may be distributed to the rest of the Structured ASIC.

Figure 2:
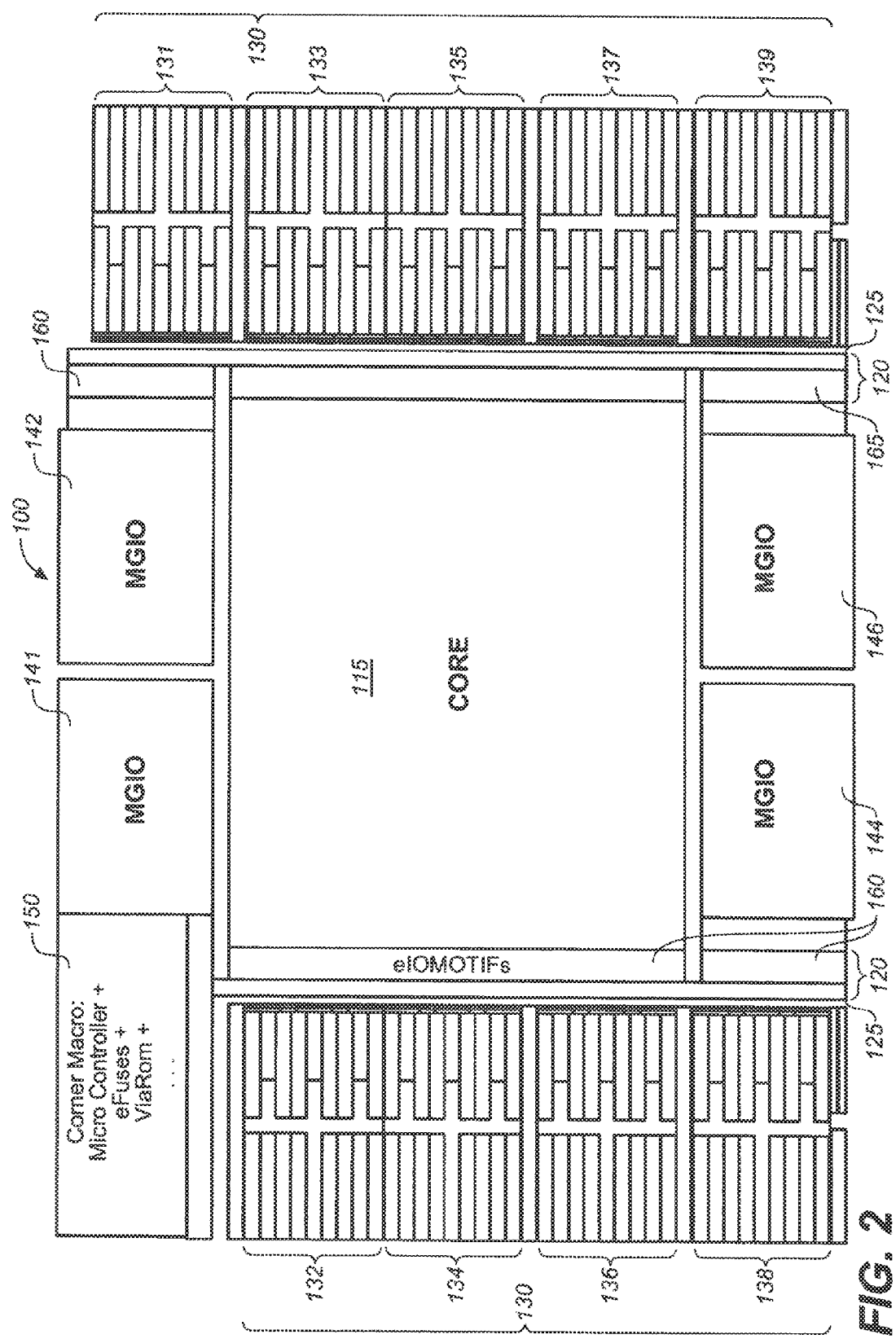
FIG. 2 is a further, more detailed schematic of the generalized floor plan layout of Structured ASIC of the present invention in block diagram form.

In FIG. 4, a plurality of IO areas are reserved on the chip of the Structured ASIC for IO, called IO sub-bank blocks, generally IO region block 130, shown as individual IO blocks 170 marked eIO 0 to 27, these blocks being programmable, via-configurable, IO blocks, and the entire collection of these IO blocks such as shown in FIG. 4 are eventually placed by the EDA tool in the general floorplan as shown in FIGS. 1 and 2. There are twenty-eight eIO cell blocks in the preferred embodiment shown due to package restrictions, but in general any number may be employed. These eIO cells are via-programmable by a customer employing the Structured ASIC, in order to make the IO accessing the core 115 conform to various standards for accessing the contents of the Structured ASIC, and support different I/O standards requirements during user mode, as well as JTAG and TEST mode. For example two eIOs such as eIO0, eIO1, can form, using via-programmable techniques, two single-ended IOs or one differential IO. Some of the interface standards supported by via-programmable eIO cells include, but are not limited to, the following interface standards, in various voltages as required by the standards: LVCMOS, PCI, PCI-X, SSTL-2 class 1, SSTL-2 class 2, SSTL-5 class 1, SSTL-5 class 2, SSTL-8 class 1, SSTL-8 class 2, SSTL-12 class 1, SSTL-12 class 2, SSTL-15 class 1, SSTL-15 class 2, SSTL-18 class 1, SSTL-18 class 2, SSTL-35 class 1, SSTL-35 class 2, HSTL12 class I, HSTL12 class II, HSTL15 class I, HSTL15 class II, HSTL18 class I, HSTL18 class II, ONFI 1.8V DDR, ONFI 3.3V SDR, LVDS, RR-LVDS, Extended LVDS, Sub-LVDS, RSDS, Mini-LVDS, Bus-LVDS, single-ended IOs, differential IOs and TMDS drivers. EIOMOTIF boundary region 160 can be part of the core 115, and can contain logic to configure the first IO fabric eIO cell blocks.

IO path areas for power related macros and sub-bank routing include area 172, labeled as "Area for power related macros and subbank routing" in FIG. 4, and then to the logical pin IO repeater areas 174, where any IO signal may be buffered and/or repeated or transmitted for eventual transmission to the logical physical pins that contact the Structured ASIC chip 100 at the periphery, for input/output to external signals.

For the Structured ASIC chip 100 there are several IO sub-bank routing blocks 130, as can be seen in FIG. 1, with four on one side and five on the other side, which have PLLs and DLLs as shown in FIG. 4, and several other sub-bank blocks that do not have PLLs/DLLs. In general any number of sub-bank routing blocks may be used.

In the IO sub-bank of IO sub-bank 130 shown in FIG. 4 there are two PLLs (Phase Locked Loops) 162 and three DLLs (Delay Locked Loops) 164, which are placed in this sub-bank floorplan routing. PLLs 162 have eight-phase rotators 163. Each PLL can produce multiple clock signals and up to eight-phases per clock signal; the eight-phase rotators 163 are muxes that select one of these eight phases with a minimum of glitches, useful for high-speed SerDes. EDT (Engineering Design Test) areas 171 and marked as "EDT17" are test logic pins for use by a third party provider, Mentor Graphics, for testing of the chip using scan-chains, as is known per se. On the IO sub-bank 130 there may also be blocks for power clamps, POR (Power On Reset), and voltage reference related blocks.

Turning now FIGS. 5A and 5B there are shown first and second schematics of the boundary routing fabric for the Structured ASIC of the present invention. A first routing fabric 160, termed eIOMOTIF boundary region, lies between the IO sub-bank 130 and core 115 of the Structured ASIC chip. Blocks 160 (eIOMOTIF boundary region) are specialized logic for interface support, to connect the core 115 with IOs such as the eIO blocks 170.

A second high-speed routing fabric comprising high speed routing fabric 180 communicates with the MGIO, high-speed Serdes, and the clock network. The high-speed routing fabric is not preconfigured to connect memory, such as BRAM blocks 110, with MGIO 140 but is preconfigured to connect logic from the core 115, such as logic cell modules 203, with the MGIO 140. Thus the high speed routing fabric 180 connects logic blocks 203 with MGIO 140; it also connects MGIO 140 with the clock network. The exact placement of the high speed routing fabric 180 vis-à-vis neighboring blocks can vary in an actual chip from the simple stylized representations as shown in the figures, and in addition there may be several layers in an ASIC chip that achieve the functionality shown, superimposed on one another, and not necessarily a single layer as shown in the drawings. This is true for most of the elements in the present invention, as understood by one of ordinary skill, and that does not detract from any of the teachings of the functional relationships between the elements of the present invention as shown herein.

Next to the high-speed routing fabric 180 are the plurality of network bridge module blocks 185, each may be held by a network socket such as network sockets 175, labeled "NW Bridge" 185. The NW Bridge modules 185 in FIG. 5A on the left and right of the core 115 have routable connections only with the Conventional Shielded fabric 187 and with eMOTIF's fabric in core 115, and go over the eIOMOTIF column 160, and not used in testing; unlike the NW1 and NW2 blocks in FIG. 6, which are used in testing. The first routing fabric comprising eIOMOTIF blocks 160 is also not used in testing and may communicate with the IO sub-bank 130 as well as with the cells in the core 115.

The associated network bridge blocks "NW1", "NW2" and logic such as network block logic connected thereto form a third network-aware IO connection fabric. The third network-aware IO connection fabric may operatively communicate with the IO sub-bank 130 and be tied to the high-speed routing fabric 180, if an ASIC designer so pleases, but primarily the purpose of the third network-aware IO connection fabric is to connect to the cells in the core 115 for testing of the same by an on-chip microcontroller 152. The logic in the third network-aware IO connection fabric is controlled by the microcontroller 152, as explained herein, primary for purposes such as testing, through BIST, the memory cells 110 in the core 115, as well as testing the via-configurable logic cell modules 203 through scan-test.

The dimensions of the routing fabric across IO region 120 can be about 750 microns; compared to the 3×3 eMotif logic array which can be about 50 microns square. The routing fabric may reside on metal layers 6, 7 and 8 (M6/M7/M8). The network block logic in the IO cells are sent a packet of instructions and/or data from the microcontroller 150, the network blocks acting in a pipeline, bus, or hybrid bus/pipeline bus manner. The microcontroller 150 sets up the network block logic, acting as intelligent agents, to either pass or not pass data relating primarily to test in the third network-aware IO connection fabric. If two potential data paths are present in the third network-aware IO connection fabric, one of the two paths can be controlled by the intelligent agent to pass data to it while blocking data to the other path. Thus the network block logic is programmed by the microcontroller 150 to pass data and establish a circuit between the microcontroller and either the memory cells 110 or logic connected to the module 203. The third network-aware IO connection fabric is used primarily for the purposes of testing but also optionally for configuration and control of the memory and/or logic. The third network-aware IO connection fabric contains logic therein, to allow this logic, such as network aware blocks, intelligent agents, such as modules NW1, NW2 in FIG. 6, and other blocks in the fabric, to be configured by the microcontroller 150 upon receipt of predetermined instructions from the microcontroller 150, in order to set up testing signal pathways to connect either the microcontroller 150 or an external tester to the memory cells and logic in core 115.

Memory cells 110 may be repaired by the microcontroller if the microcontroller determines the memory is defective during test, since each memory has a redundant bit for repair in case one bit on a memory cell is defective, then muxes on the memory will render operable the redundant bit to repair the defective bit. The microcontroller can also be run in debug mode to query each memory one at a time.

Conventional shielded routing fabric 187 is for conventional routing through via-programmable connections and may connect to PLLs, DLLs and the boundary of core 115. There may also be a communication nexus between the conventional shielded routing network 187 and the high-speed routing fabric 180, IO sub-bank 130 and network-aware IO cells 160, or more generally between the first, second and test routing fabrics, if required by a design, dependent upon the designer, though in general such nexuses are not preconfigured ahead of time in the chip 100.

FIG. 6 is a more detailed schematic of the high-speed routing fabric 180 of the present invention used to communicate with high-speed devices. The high-speed fabric 180 connects IO logic block 203 and memory cells 110 of core 115 of the Structured ASIC chip 100 with the MGIO block(s) 140 and may extend around the sides of the rectilinear chip 100. In addition high-speed routing fabric 180 may communicate with any high-speed memory such as DDR, and the clock network of chip 100, and may exist on metal layers M2/M3/M4. The clock routing 184 is shielded or double shielded and balanced (the delay from the clock source to any destination of its branch having the same delay) to allow proper clock routing and have signal lines that are properly spaced (extended spacing) to avoid interference and allow proper synchronization. The high speed fabric 180 is comprised of high speed buffers 182 that are found in metal layer M4 and are connected to clocking routing 184. This routing fabric can appear in one or more of the non-customizable metal layers like metal layers M6, M7 and M8. The clock signal could be distributed along signal metal layers M2, M3 and M4. The clock signal lines for the clock tree may come to the plane of the paper defining the figures from a substantially orthogonal or perpendicular channel at right angles to the plane of the paper, from an underlying metal layer. The clock tree may be connected to the eIOMOTIF boundary region 160 blocks of the IO region 120 and operatively connected to a clock tree that lies in the plane of the paper and the clock tree is balanced, and operatively connected with its branches to the core 115 to connect to the clock macro 215 in the center of the eMotif eCELL Matrix 203, and to any clock lines leading to memory column 110. High speed fabric 180 further has additional buffers 186 that can buffer the signal from high-speed buffers 182.

Figure 6A:
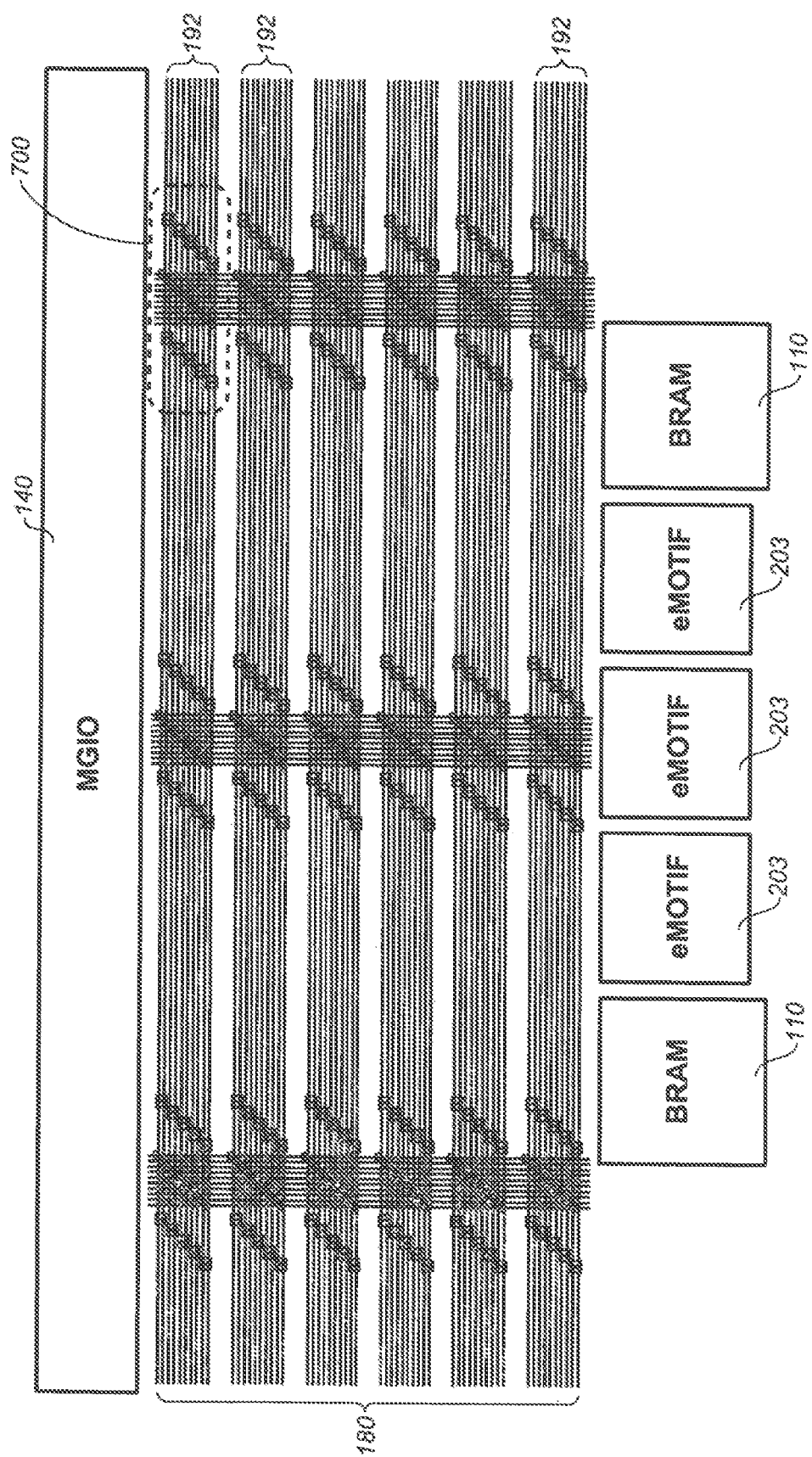
FIG. 6A is a more detailed schematic of a portion of the high-speed routing fabric of FIG. 6, showing a portion of FIG. 6.
Figure 6B:
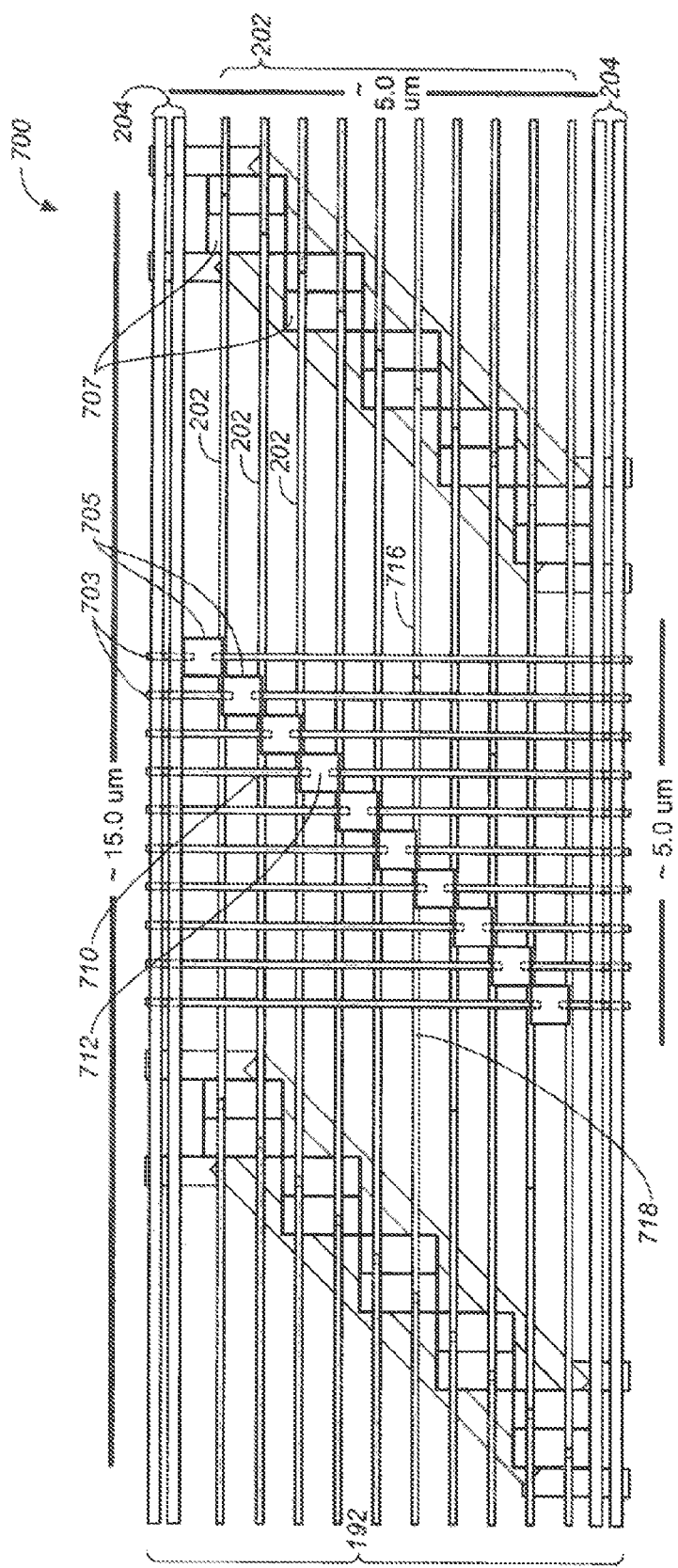
FIG. 6B is a more detailed schematic of a portion of the high-speed routing fabric of FIG. 6A.

Further details of the signal lines comprising high-speed buffer 180 are found in FIG. 6A and FIG. 6B. FIG. 6A is a more detailed schematic of a portion of the high-speed routing fabric of FIG. 6, showing the signal traces in groups of six, at groups 192. As best seen in FIG. 6B, at dotted portion 700, each block of signal traces has ten inner lines 202 in the middle for passing signals and two sets of outer lines 204 for power and ground. Wires 703 pass vertically while wires 202 (for signal/clock) and 204 (for power) pass horizontally as shown. The wires in groups 192 form a planar network, that is, the wires 202, 204 and 703 do not electrically intersect, however there may be vias placed (not shown) to connect them if need be where the horizontal and vertical wires cross at groups 192.

Block 705 is a planar connection block that may be used for programmable connection of the top of the wire 703 to the bottom of the wire 703, as normally there is a open circuit condition at the place where the wire 703 enters the planar box connection block 705. If the block 705 is closed there can be electrical conduction between the top and bottom of wire 703. The programmable planar connection blocks 705 are placed in a diagonal line as shown, to provide a better layout. Buffers 707 are placed along a diagonal line to create a balanced signal, facilitate the signal, and connect to the horizontally placed wires 202.

The high-speed routing fabric of FIGS. 6, 6A and 6B is ideally suited for clock trees and/or connection to the MGIO blocks in a balanced manner. For example, a signal travels along the vertical line 703 and has to be split, as is common in a clock tree, into two equal branches that are balanced. The second, high-speed IO routing fabric shown in these figures will allow the signal to be split if the planar box 705 is enabled to conduct. A signal traveling to and from the vertical direction, say along wire 710, can be connected at planar box 712 to be split to also travel, once a via is formed at the intersection of the vertical wires, such as wire 710 and the horizontal wires, such as wires 202, so that the signal travels along the horizontal directions along lines 716, 718 in a balanced manner such as for a clock tree. Any number of connections may be made as can be appreciated by one of ordinary skill in the art from the teachings herein. Hence, in this way the high-speed routing fabric of FIGS. 6, 6A and 6B can form a form of matrix or crossbar switch.

Figure 7A:
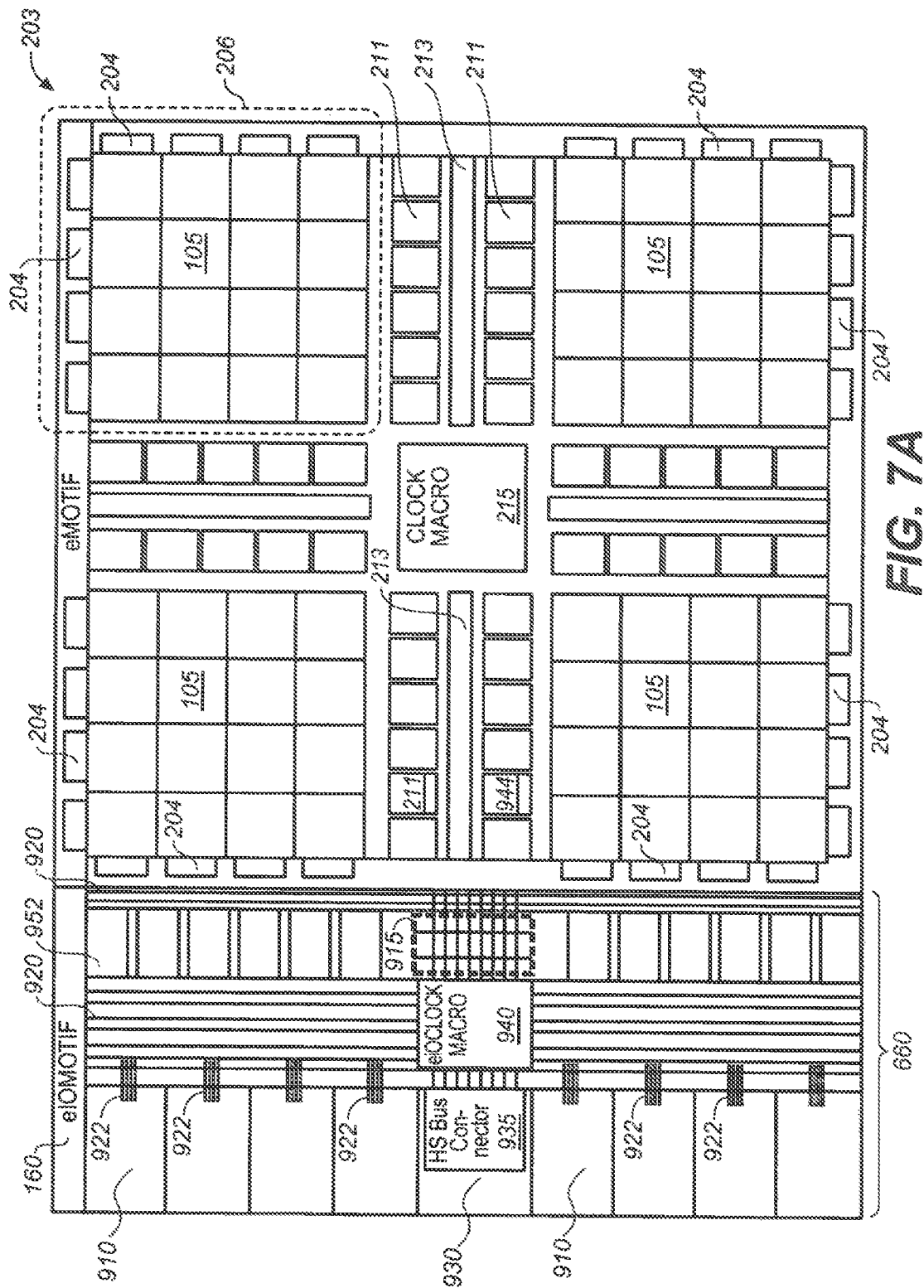
FIGS. 7A and 7B show a portion of a connection fabric in the boundary routing fabric, showing incorporation of Digital Control Delay Lines (DCDL).
Figure 7B:
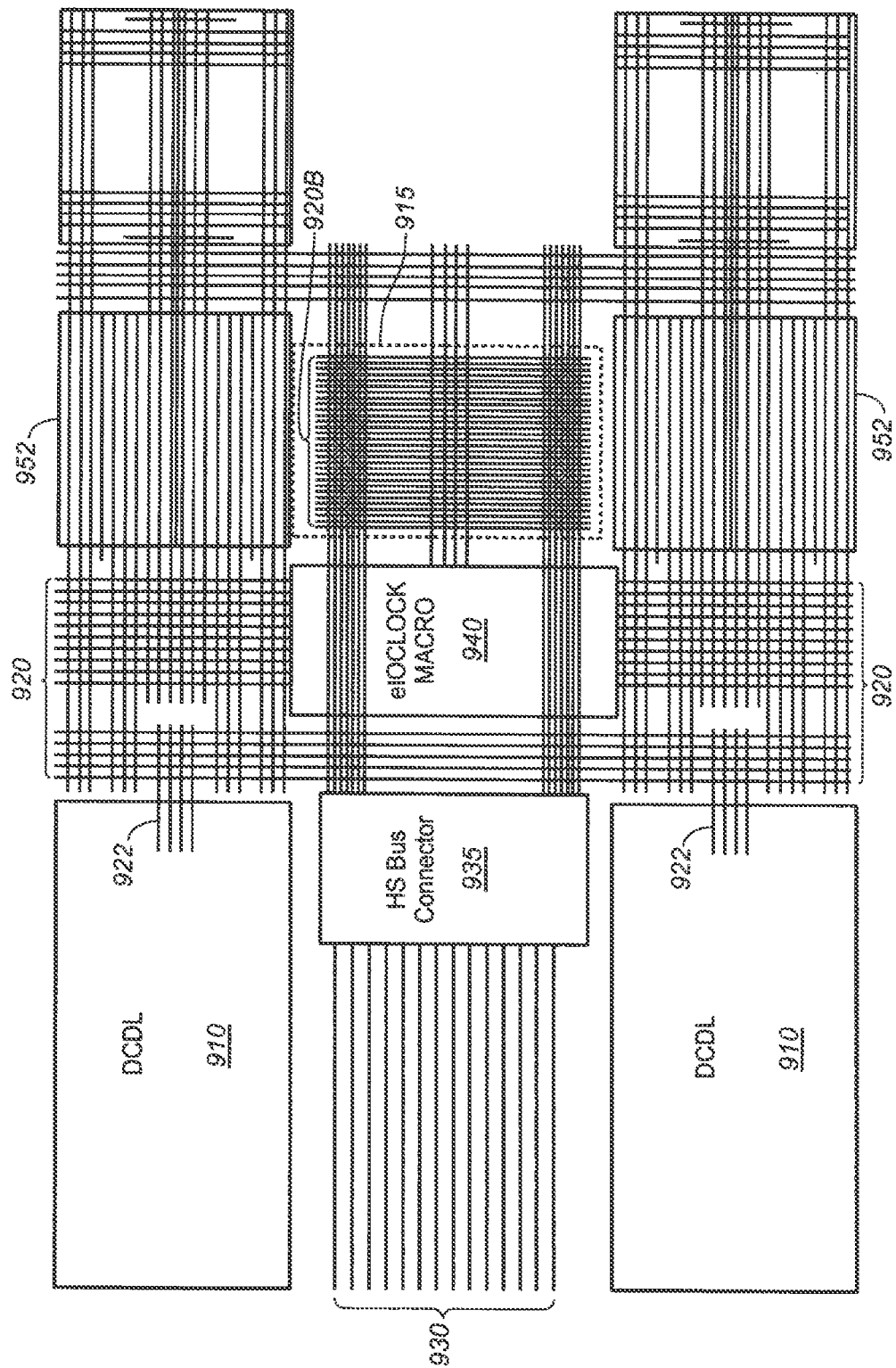

FIGS. 7A and 7B show a portion of the network-aware connection fabric 160, termed eIOMOTIF boundary region, showing incorporation of Digital Control Delay Lines (DCDL) 910 next to the logic unit blocks 203, termed eMotif, used for the logic and memory core 115 of chip 100 of the Structured ASIC of the present invention. The DCDL 910 is placed in the eIOMOTIF boundary region network-aware IO fabric 160 along the north-south periphery of core 115. Roughly half of the fabric 160 is comprised of DCDL blocks 910, which may be tied together vertically as shown in serial, and are aligned with the horizontal rows formed of eMotif logic modules 203. This is done to give the user of the Structured ASIC chip 100 maximum flexibility in things like adjusting the global clock signal, PLL/DLLs and IO signals, with IO such as found in routing fabric eIOMOTIF boundary region 160. Thus as shown in FIG. 7A there is the network-aware IO fabric 160 in which the DCDL appears in, as DCDL blocks 910 cooperating with and operatively connected to an eMotif logic unit block 203 used for supporting random logic in the Structured ASIC of the present invention. In addition, the DCDL blocks 910 may cooperate with and be operatively connected to the first routing fabric of IO sub-bank 130 for interacting with any DLLs and PLLs found therein. A clock bus 920 provides for global clock tree routing of clock signal lines, as explained herein, the clock signal lines may come from a different metal layer which comes out from vertical channels lying perpendicular to the plane of the paper that the clock bus 920 lies in. The clock bus 920 cooperates with the eIOMOTIF boundary region clock macro 940 and a cross-bar switch 915 (which also receives clock wires coming out of the plane of the paper, not shown, to form a crossbar) and with HS Bus (high-speed bus) connector 935. Clock bus 920 can be tied to the eIOMOTIF boundary region fabric 660 and consequently DCDL blocks 910 such as shown conceptually with lines 922, in order for the DCDL blocks to affect the clock signal. By virtue of being tied to a plurality of IO fabrics including the eIOMOTIF boundary region fabric 660, the eMotif module 203 (and any associated connection fabric within core 115), as well as IO connection fabric 130, the DCDL blocks can affect any number of components and systems including global and local (regional) clock trees, DDLs, PLLs, IOs and their interface standards, and the like. High speed fabric bus 930, comprising of 14 lines and which can be tied to the high-speed IO routing fabric 180, is tied via High-Speed Bus Connector 935 to the clock crossbar 915 via eIOCLOCK MACRO 940 which acts as a router concerning the clock signal. High-speed data flip-flop blocks, four to six D flip-flops, also known as data flip-flops, per block, can be provided at data flip-flop blocks 952 for connection to the core logic of core 115.

Hence again turning attention to FIGS. 7A and 7B, there is shown the connection fabric termed eIOMOTIF boundary region showing incorporation of Digital Control Delay Lines (DCDL) in blocks DCDL 910. In integrated circuits often clock or data signals need to be adjusted for skew and for timing, with the adjustment occurring as a fraction of a normal clock cycle period. This can be done through Digital Delay Control Line (DCDL) circuitry 910. The Digitally Controlled Delay Line (DCDL) is for delaying input or output signals, primarily clock signals, but may also include delaying IO signals (which sometimes require delay due to various IO standards) in the IO region 130, and other signals such as Delay Locked Loops (DLL), or Phase Locked Loops (PLLs)

into or out of the core logic 203 of the chip 100. The DCDL also can be used with any PLL or DLL in the peripheral IO regions of the core of the RUBY chip such as IO region 130, and may be operative connected to the eIO IO blocks 170 of the IO region 130 to control any signals in these eIOs through signal lines that run through HS Bus connector 935. In the eIOMOTIF boundary region fabric 160 there are a plurality of DCDL blocks 910 communicating in a east-west (horizontal) fashion with a global clock bus connected to the chip 100 global clock tree. The global clock tree has eighteen vertical lines 920 and thirty-two vertical lines 920B (some of these lines leading to vertical lines 920B coming out of the plane of the paper in FIG. 7B so therefore not shown) and the global clock tree may also be connected to a regional clock tree (not shown). The global clock is operatively connected to the EMotif logic unit block module 203. The DCDL blocks 910 connected to the global clock tree bus lines 920 through connections 922 and further the DCDL blocks and the clock bus communicate with high-speed data flip-flops (DFF) 952, which in turn are operatively connected to core region 115 via connections. As can be seen, the DCDL which is operatively connected the modular array 203 is comprised of a plurality of DCDL blocks 910 such that each modular array 203 is adjacent a plurality of DCDL blocks 910; in a preferred embodiment eight DCDL blocks 910 are present for each modular array 203 as shown in FIG. 7A, and these eight DCDL blocks 910 may be connected in series for greater delay of a signal. A high-speed fabric bus 930 (fourteen wires in FIG. 7B), which typically communicates with DLLs and PLLs in IO sub-banks 130, is connected to a high-speed bus connector 935 which in turn communicates with eIOCLOCK MACRO 940 (which receives some of these lines from the bus connector 935 as inputs from the west, and some lines from the north and south, and outputs to the east to a crossbar switch 915). The eIOCLOCK MACRO 940 serves as a router to route any of three input lines to output lines at the east end of the macro, and thus may connect the clock bus 920 and the high speed fabric bus 930 to a cross-bar switch 915, and, in addition some of these 14 lines from high-speed fabric 930 are routed around the eIOCLOCK MACRO 940 rather than through it (seven lines on top of eIOCLOCK MACRO 940 and seven lines on bottom) to a cross-bar switch 915 for connection with other clock signals. All of the connections and switches forming connection fabrics in chip 100 may be via programmable.

Further, as shown in FIG. 7B, the cross-bar switch 915 receives from its north and south ends lines of a clock bus 920B, comprising thirty-two signal wires in a preferred embodiment, which provides for global clock tree routing (part of these thirty-two wires from a core clock bus come out of the plane of the paper from another layer or layers, e.g. metal layers, not in the plane of the paper of FIG. 7B, and hence cannot be shown in FIG. 7B in their entirety, but are shown partly as clock wires 920B), to cross at cross bar switch area 915. Another eighteen vertically extending shielded wires for the clock are shown at routing fabric and clock bus lines 920, which cooperate with the eIOCLOCK clock macro 940 and form an input to the same, from the north and south ends of the macro 940. eIOCLOCK clock macro 940 thus has three input lines from the north, south ends (for the clock bus line 920) and west end (from the lines from HS Bus Connector 935) and one output line on its east side, comprising a plurality of eighteen lines. The three input lines are from the north (top), west (left) and south (bottom) sides, and comprise clock lines from the routing fabric and clock bus lines 920 for both the north and south directions, and fourteen lines from a high-speed fabric having connector HS bus connector 935, that may connect to DLLs/PLLs, and which arrive into the eIOCLOCK macro 940 from the west. EIOCLOCK clock macro 940 is thus for routing signals, receiving as input lines from high-speed HS bus Connector 935 (which can connect to a high-speed fabric that services for example PLL/DLLs) from the left, routing fabric and clock bus lines 920 from the top and bottom, and outputs 14 lines to the right. Clock macro 940 also contains a cross bar internally (not shown) to aid in routing. At cross-bar switch 915, the lines from a high-speed HS bus connector 935 and the clock macro 615 cross with the thirty-two wires of the global clock, core clock bus tree that come out of the plane of the paper for further routing to the eMotif 203.

The routing fabric and clock bus lines 920 can be tied to DCDL blocks 910 such as shown conceptually with lines 922, for the DCDL blocks to affect the clock signal. A high-speed fabric bus (fourteen wires) 930, which typically communicates with DLLs and PLLs found in IO region 130, as well as eIO cells as explained herein, is connected to a high-speed bus connector 935 which in turn communicates with the clock lines via cross-bar switch 915 and can further be operatively connected to the routing fabric and clock bus lines 920 and DCDL blocks 910. The cross-bar switch 915 can interconnect in a matrix switch from the following signal lines: in the east-west direction, the fourteen lines that ultimately come from the HS bus connector 935 (these lines are routed past the eIOCLOCK clock macro 940 and not through it), the output lines, traveling east, of eIOCLOCK clock macro 940, and, running vertically in north and south directions, the thirty-two signal wires of the core clock bus 920 (which enter from points that come out of the plane of the paper from a metal layer and entering the plane of the paper in the figure from a substantially orthogonal direction) to enable any vertical line to be connected to any horizontal line. The output of the cross-bar switch 915 extends horizontally into the eMotif logic module 203.

By virtue of being tied to a plurality of IO fabrics, the eMotif module array 203 (and any associated connection fabric within core 715), as well as IO connection fabric 130 and any associated clock bus lines, the DCDL blocks can affect any number of components and systems including global and local (regional) clock trees, SerDes, such as connected to any high-speed IO routing fabric, DDLs, PLLs, IOs and their interface standards, and the like; in addition the DCDL blocks 910 can be tied to the IO sub-bank 130 to affect any DLL or PLL found therein. For example, the DCDL blocks, are operatively connected to the data flip-flop blocks 952 (called eDFF) for connection to the core logic, and to the DLL/PLLs (e.g. through HS Bus Connector 935) as well as programmable IO in a chip (i.e., the programmable IO in a region to the left of the DCDL blocks 910, e.g. the individual IO blocks 670 termed eIO, which are shown in IO routing fabric region 130, and tied to the eIOMOTIF boundary region 160), the programmable IO being also connected to the DCDL blocks 910 through the HS Bus Connector 935. In this way the DCDL blocks can thus influence any clock or data signal line in these areas. As mentioned the eight DCDL blocks 910 may be connected in series along the sides of the eMotif logic block 203.

Figure 8:
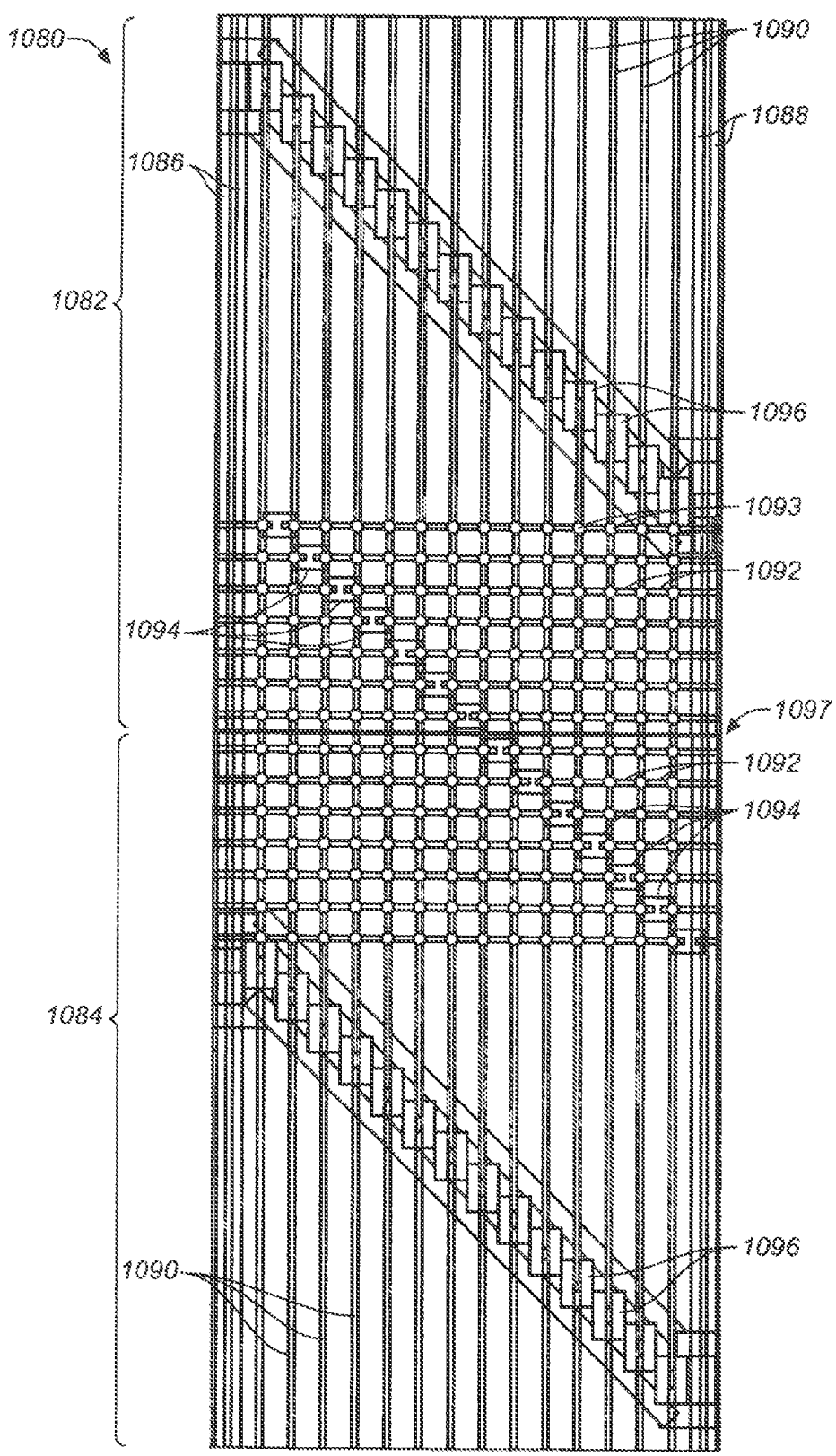
FIG. 8 shows a close up portion of a unit of a second high-speed routing fabric of the present invention.

FIG. 8 is a more detailed schematic close up of a second high-speed routing fabric 1080 of the present invention (a third routing fabric) used to communicate with high-speed devices. It should be noted that this third routing fabric high-speed routing fabric 1080, which also appears in FIG. 5A running vertically north-south, appears very similar to the second routing fabric, the first high-speed routing fabric 180 of FIG. 6, which runs horizontally (east-west), but is different in application. The high-speed fabric 1080 connects IO logic block 203 and memory cells 110 of core 115 of the Structured ASIC chip 100 with the DCDL, clock, IO region 630 and memory or communication interfaces (e.g. DDR SDRAM, double data rate synchronous dynamic random-access memory), fits in space 620 in-between the IO region 130 and eIOMOTIF 160, and the fabric 1080 fits along the north-south extending vertical sides of the substantially rectilinear chip 100. In addition high-speed (HS) routing fabric 1080 may communicate through an interface with any high-speed memory such as DDR found outside the chip, the clock network of chip 100, the PLLs/DLLs of the first routing fabric and may exist on any of the metal layers. The high-speed third routing fabric 1080 may be connected to the high-speed fabric bus 930 (fourteen wires in FIG. 7B), which typically communicates with DLLs and PLLs in IO sub-banks 130. The high-speed routing fabric 1080 is shielded or double shielded and balanced by its nature, as explained further herein, so any delay from one point to any destination of its branch has the same delay, to allow proper signal and clock routing by its very construction. The high-speed routing fabric 1080 of FIGS. 8, 9 can form a type of crossbar switch, accepting multiple inputs and giving multiple outputs, as explained below, and in a preferred embodiment giving a balanced binary tree having at least two nodes at each branch.

As best seen in FIG. 8, the HS routing fabric is composed of a plurality of units, such as HS units 1082, 1084, with unit 1084 simply being unit 1082 rotated by 180 degrees. Each eMotif logic block 203 will have four of such HS units operatively abutting it, servicing it. Extending vertically, there may be hundreds of such HS units, depending on the number of eMotif logic blocks 203 present. The HS units have on both the left and right sides vertically extending power and ground lines 1086, 1088, which are somewhat larger in diameter than the vertically extending signal wires or lines remaining, fourteen of which are shown, which convey a signal, such as a clock signal or any other high-speed signal. Another plurality of horizontally extending wires or lines 1092 also are for carrying signals, and can be made to electrically connect to any vertically extending signal line 1090 by filling a via, in a via programmable manner, such as via 1093, which can be filled or open, as the designer sees fit, to connect the vertically extending signal line 1090 to the horizontal extending signal line 1092. The vertical and horizontally crossing wires in the HS units form a planar network where they intersect.

A plurality of planar connection blocks or connectors 1094 can be made to connect what is normally an open circuit at each of the lines 1092 in which these connectors are placed inline with the lines 1092. By filling the connectors, preferably in a via-configurable manner, to close, the lines 1092 go from an open circuit to a closed circuit state and conduct a signal. Once the connectors 1094 are closed there can be electrical conduction in the horizontally extending wires 1092. The via programmable planar connection blocks 1094 are placed in a diagonal line as shown, to provide a better layout. Inverters or inverting buffers 1096 are placed along a diagonal line to create a balanced signal, facilitate the signal, and connect to the horizontally placed wires 1092. The distance of each inverter 1096 from the connectors 1094 are equally spaced so any signal that branches from the connector takes the same amount of time to traverse one branch leading up as a signal does to traverse the other branch leading down. The HS units 1082, 1084 have a planar network end 1097 and an open end 1098. To form a planar network, as shown, the two planar network ends of HS units 1082, 1084 are abutted end to end.

Figure 9:
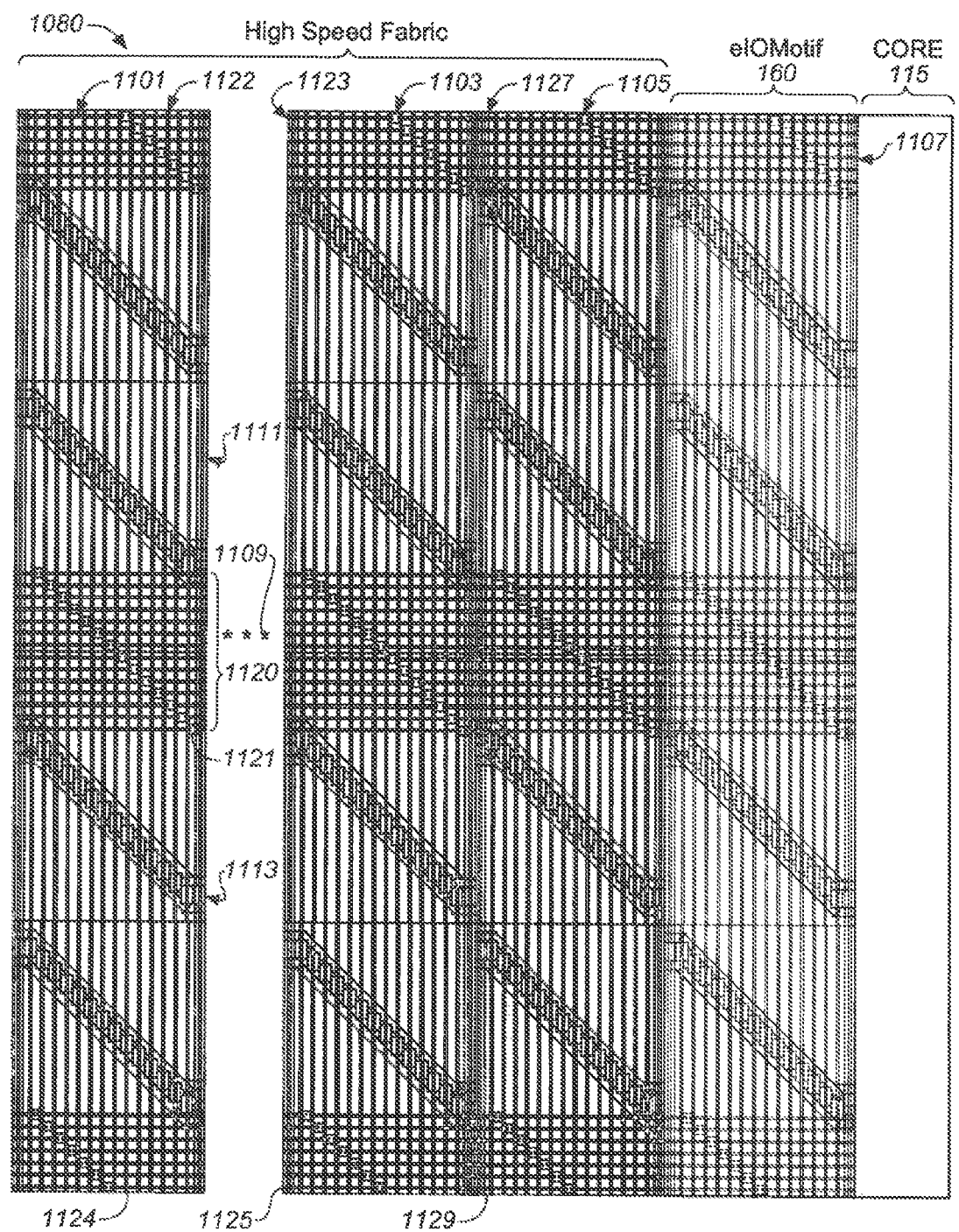
FIG. 9 shows the second high-speed routing fabric as it is deployed in the Structured ASIC of the present invention.

FIG. 9 shows the HS units of the high-speed routing fabric 1080 arranged in columns next to a single eMotif logic block 203. Thus, as shown, four HS units are shown arranged in each column, such as a plurality of vertically extending (north-south) columns such as HS columns 1101, 1103, 1105, 1107 (with ellipses 1109 indicating more columns may be present, not shown). In addition, there are four HS units shown because it is assumed that there is just one eMotif logic block 203 abutting the last column 1107, but in fact in a chip each eMotif block would abut four such HS units and many hundreds of such eMotif blocks 203 would be present—in one preferred embodiment over 1.77M such eMotif blocks are present. In one preferred embodiment eight such HS columns exist. The last column, 1107, may actually lie underneath the eIOMotif boundary routing region 160 for connection to the eMotif 203. The two middle HS units in each column form the main planar network, such as HS units 1111, 1113. Each eMotif block 203 would have in a preferred embodiment eight such HS columns in the horizontal direction and many HS units in the vertical direction.

The high-speed routing fabric of FIGS. 8,9 is ideally suited for clock trees in a balanced manner. For example, a signal travels along the horizontal direction and has to be split, as is common in a clock tree, into two equal branches that are balanced. This occurs at any planar connector 1094 or at any via 1093 between the vertical and horizontal lines 1090, 1092. At each column at each planar connector 1094 or at any via 1093 a signal may be split into two, to travel in two paths, hence in each column there can form any number of branch nodes of a binary tree. With eight columns, and sufficient connections, a signal may be split into $2^8$ power or 256 levels or branches. This is ideal for a clock tree.

An illustration of the myriad connections that may be possible given the structure of FIGS. 8, 9 may be given, with the understanding a skilled designer can come up with many more configurations from the teachings herein. Hence, by way of example, in FIG. 9, to form a clock tree of say eight levels, a signal would come in at a horizontal planar connector line, e.g. line 1121, into the center planar connection region 1120 of the HS fabric, feeding the first planar connector of HS units 1111 and 1113 of the first HS column 1101 upon which the signal is split into two by the first planar connector of the column 1101 (e.g., the farthest to the left and top row planar connector) to travel along a vertically extending line 1090, and is sent to each of the ends of the column, at ends 1122 and 1124, upon which the signals, through suitable connections at these ends (these connections being via-programmable), travels along a horizontally extending line 1092 to feed into either the next column at ends 1123 and 1125 (assuming for the sake of this example there are no intervening columns such as indicated by the ellipses 1109), or, into another vertically extending line 1092 at the same column (as there are many such lines given each eMotif cell 203 abuts eight such columns in a preferred embodiment, and there may be several hundred thousand such eMotif cells. At that point the two signals again move to a center planar connection region 1120, such as for example the second HS column, HS column 1123, or an adjacent first HS column from another eMotif cell, where there are now two signals on two lines, that are split into four signals. Now there are four signals being sent to the ends 1123, 1125 of the HS units of the high-speed fabric 1080, and these four signals would be connected, through via-programmable connections, to the third column, HS column 1105, or to the same column in an adjacent eMotif cell 203. These four signals would now be each split into two signals to form eight signals, at the center planar connection region 1120 of the third column, HS column 1105, or at the center planar connection region of the same column in an adjacent eMotif cell 203. At this point you would have eight leaves of this tree. This process can continue up until all eight columns (in a preferred embodiment) are exhausted, so you can have 256 levels of a balanced binary tree in this manner (2^8=256) throughout the chip 100.

In an actual design the more general case is to have several trees in parallel, each using different lines in the high-speed fabric 1080. Hence one has say eight entry points on the left hand side of the HS fabric 1080 which runs down the north-south side of the chip 100 and eight destination points running into the core 115 of the chip 100, all handled by the HS fabric working with the eIOMOTIF fabric 160, and running into the boundary eMotif cells 203. Eight entry points are often used with phases in PLL/DLLs in the chip 100. Multiple entry points are also used with DDR SDRAM interfaces, as explained further herein. The routing delay will be the same for any and all of these entry and destination points due to the balanced nature of the HS fabric 1080.

The HS fabric 1080 abuts a single eMotif 203 module on one side as shown in FIG. 9, but it can support in fact support three columns of such eMotif modules, which are aligned in rows (the other two eMotif modules to the right of eMotif module 203 in FIG. 9 not shown for example, which lie in the same row as the HS fabric 1080). Thus the unit of the HS fabric 1080 shown in FIG. 9 can support three eMotif cells in the same row, and so on (as the HS fabric 1080 extends in the vertical direction in a columnar form), so the HS fabric 1080 can support three columns of eMotif cells.

The HS fabric 1080 can be operative connected to the eIOMOTIF fabric 160, which is tied to both the eMotif cell modules 203 and the eIOs of IO sub-bank 130. The HS fabric and the trees that are capable of being built in it can support the global clock tree for chip 100.

The HS fabric 1080 can also support an interface for memory, such as DDR, (DDR SDRAM) and any associated logic for this interface to DDR (the actual DDR memory itself is found outside the chip 100). The HS fabric 1080 also supports eIOs and DLLs/PLLs in the IO sub-bank 130, including but not limited to single-ended IOs and differential IOs found therein. A byte of DDR interface includes data for eight single-ended IOs, a differential IO for any synchronization strobe, and data for the PLL/DLL. This DDR interface is readily implementable from the hardware of the present invention, despite the strict requirements for skew, cross-talk and balancing, by utilizing the eIOMOTIF fabric, and eMOTIF modules. Using the hardware one could even construct a hard macro to achieve the functionality of the DDR interface. Using the present invention any interface including but not limited to any serial data streams, serializers/deserializers, network interfaces, and other data interfaces.

Regarding the present invention, it is important to reiterate that the floorplan of the Structured ASIC is providing an infrastructure for a customer to use to build some sort of circuit of value to the customer, primarily through programmable vias. The number of circuits that can be built, and the various interconnections between the elements of the Structured ASIC, is a large set.

FIG. 10 is a table of the parameters of the various components comprising the Structured ASIC of the present invention. The chart speaks of the dimensions of the chip, for six versions of the chip, with "Numb" standing for 'number'. Thus the area in preferred embodiments of the chip is shown in the first row of the table in FIG. 8, ranging from 20.71 mm2 to 158.71 mm2; the number of logic cells in logic cells 105 in all the eMotif eCELL Matrix blocks 203 is shown in the second row and range from 84672 to 1774656, with the larger number residing on the larger area chip; the number of Full Adders (FA) range from 42336 to 887328; the number of D-flip flops range from 58212 to 1220076; the amount of memory, BRAM in bits ranges from 2.3 Mb to 55.7 Mb; BRAM instances ranges from 252 instances to 6004 instances; the number of MGIO components range from 8 blocks to 48 bocks; the number of package IOs range from 308 to 960 IOs (or more for certain IO package type embodiments); and the number of wire bound connections range from 175 to 547. Thus by definition not every conceivable variation of interconnection that is possible using the architecture of the present invention can be readily described in a single document of reasonable size, but the essential features are described in the present application, as can be appreciated by one of ordinary skill in the art.

Regarding manufacture of the present invention, the via-configurable Structured ASIC of the present invention may be manufactured on a 28 nm CMOS process lithographic node or smaller and having feature sizes of this dimension or smaller. The method of manufacturing the ASIC may be as the flow was described herein in connection with an ASIC and/or Structured ASIC. The floorplan of the Structured ASIC of the present invention is manufactured using a CMOS process using NFET/nMOS and PFET/pMOS transistors, which includes a via-configurable logic block (VCLB) architecture. VCLB configuration may be performed by changing properties of so called "configurable vias"—connections between VCLB internal nodes. The configurable vias that are used to customize the chip at a plurality of metal layers, and preferably between two metal layers with a single via layer, and are changed by the customer that deploys the Structured ASIC. While the preferred layout is as a traditional 2D chip, 2.5D chip layout may also be employed.

Modifications, subtractions and/or additions can be applied by one of ordinary skill from the teachings herein without departing from the scope of the present invention. For example, though the invention discusses three IO connection fabrics as discrete entities or layers, it is possible to combine the functionality of two or more such connection fabrics into a single IO connection fabric, if it performs the same functionality as taught herein, without departing from the scope of the present invention. Thus the scope of the invention is limited solely by the claims.

It is intended that the scope of the present invention extends to all such modifications and/or additions and that the scope of the present invention is limited solely by the claims set forth below.

We claim:

1. A structured application specific integrated circuit (Structured ASIC), comprising:
   a core comprising memory cells and logic cells;
   a first IO routing fabric comprising a plurality of IO blocks along sides of the core, operatively connected to the core, the first IO fabric comprising a first routing fabric;
   a second IO routing fabric comprising a high-speed routing fabric operatively connected to the core; wherein,
   the second IO fabric is faster in data transfer than the first IO fabric, and the Structured ASIC is configured through via-configurable interconnections in the Structured ASIC, wherein
   the core is substantially rectilinear;
   the core logic cells comprise a module array having a plurality of logic cells arrayed in a repeating pattern;
   the first routing fabric is configurable through vias in the Structured ASIC, and connects the core to logical pin IO repeater areas;
   the module array further comprising a plurality of flip-flops, a clock macro, full adders and buffer cells operatively connected; and, the memory cells and logic cells of the core alternate and repeat in layout in columns along the vertical north-south direction to the core.

2. The Structured ASIC according to claim 1, further comprising:
a test routing fabric operatively connected to the module array and the core memory cells;
a microcontroller, operatively connected to the test routing fabric and forming a network with the test routing fabric and the core memory cells; and, a network bridge logic block for directing the data from the microcontroller to the core memory cells.

3. The Structured ASIC according to claim 2, further comprising:
a block of electronic fuses to store memory addresses that need repair, and, circuitry connected to the core memory cells for repairing defective memories as ascertained by the microcontroller.

4. The Structured ASIC according to claim 1, further comprising:
a test routing fabric operatively connected to the module array and the core memory cells;
a microcontroller, operatively connected to the test routing fabric and forming a network with the test routing fabric and the core memory cells; and, a network bridge logic block for directing the data from the microcontroller to the core memory cells; and,
the first routing fabric aligned to the sides of the core and connected along the north-south, vertical sides of the core.

5. The Structured ASIC according to claim 4, wherein:
a plurality of full adders for each module array, external to the logic cells, and, the clock macro is in the centre of the module array, with the flip-flops and buffer cells forming a cross-shape in the module array; and,
further comprising, a SerDes operatively connected to the second high-speed routing fabric IO, the SerDes aligned along the east-west, horizontal side of the core.

6. The Structured ASIC according to claim 1, further comprising:
a clock bus operatively connected to the module array of the core logic cells; and,
a plurality of Digital Control Delay Lines operatively connected to the first routing fabric and to the clock bus, in order to delay any signal on the clock;
the first IO fabric comprising a plurality of IO blocks attached to the north-south, vertical sides of the core;
a plurality of clock signal lines operatively connected to the test routing fabric comprising a clock bus;
Digitally Controlled Delay Line blocks operatively connected to the modular array so that each modular array is abutting and adjacent to a plurality of DCDL lines, the plurality of DCDL blocks operatively connected to first routing fabric.

7. The Structured ASIC according to claim 6, wherein:
the second IO routing fabric comprises a crossbar switch between conductive paths that travel vertically and horizontally to the core; and,
the second IO crossbar switch contains buffers and planar box connection blocks connected to the vertically and horizontally traveling conductive paths of the crossbar switch.

8. The Structured ASIC according to claim 6, further comprising:
a high-speed bus connector comprising signal lines connected to the first routing fabric;
a clock macro forming a router for accepting as inputs the plurality of clock signal lines connected to the first routing fabric and the signal lines of the high-speed bus connector and having output lines;
a second plurality of clock signal lines, the second plurality of clock signal lines arising from a different layer orthogonal to the first plurality of clock signal lines;
a crossbar switch for accepting the second plurality of clock signal lines, signal lines of the high-speed bus connector, and the output lines of the clock macro; and, wherein, the crossbar switch is operative connected to the modular array of logic cells.

9. The Structured ASIC according to claim 1, wherein:
a SerDes operatively connected to the second high-speed routing fabric IO;
the area of the Structured ASIC is between 4.32 mm$^2$ and 12.34 mm$^2$ inclusive;
the number of logic cells in the Structured ASIC is between 84672 and 1774656 cells inclusive;
the number of full adders is between 42336 and 887328 inclusive;
the flip-flops are D flip-flops and the number of D flip-flops is between 58212 and 1220076 inclusive;
the memory cells are BRAM bit memory cells an range in size from 2.3 Mb to 55.7 Mb inclusive; and,
the number of instances of BRAM range from 252 to 6004 instances, inclusive.

10. The Structured ASIC according to claim 4, wherein:
the area of the Structured ASIC is between 4.32 mm$^2$ and 12.34 mm$^2$ inclusive;
the number of logic cells in the Structured ASIC is between 84672 and 1774656 cells inclusive;
the number of full adders is between 42336 and 887328 inclusive;
the flip-flops are D flip-flops and the number of D flip-flops is between 58212 and 1220076 inclusive;
the memory cells are BRAM bit memory cells having a range in size from 2.3 Mb to 55.7 Mb inclusive; and,
the number of instances of BRAM range from 252 to 6004 instances, inclusive;
and,
the first routing fabric comprises via-configurable 10 blocks that are configurable to conform to the one of the following interface standards selected from the group consisting of LVCMOS, PCI, PCI-X, SSTL-2 class 1, SSTL-2 class 2, SSTL-5 class 1, SSTL-5 class 2, SSTL-8 class 1, SSTL-8 class 2, SSTL-12 class 1, SSTL-12 class 2, SSTL-15 class 1, SSTL-15 class 2, SSTL-18 class 1, SSTL-18 class 2, SSTL-35 class 1, SSTL-35 class 2, HSTL12 class I, HSTL12 class II, HSTL15 class I, HSTL15 class II, HSTL18 class I, HSTL18 class II, ONFI 1.8V DDR, ONFI 3.3V SDR, LVDS, RR-LVDS, Extended LVDS, Sub-LVDS, Mini-LVDS, Bus-LVDS, single-ended IOs, differential IOs, TMDS drivers and RSDS.

11. The Structured ASIC according to claim 1, further comprising:
a third routing fabric comprising a high-speed routing fabric aligned to the sides of the core and connected along the north-south, vertical sides of the core;
the third routing fabric comprises a third routing fabric switch forming conductive paths that travel vertically and horizontally to the core, and operatively connected to the first IO routing fabric;
the third fabric switch contains inverters and planar box connection blocks connected to the vertically and horizontally traveling conductive paths of the switch;

a plurality of the third routing fabric switches arranged in columns in the third routing fabric, the plurality of columns operatively electrically connected to one another through programmable vias; wherein, a binary tree of connections is employed in the third routing fabric in the conductive paths, with each column forming a branch node of the binary tree of connections; and, wherein the tree of connections forms a balanced tree.

12. A method for constructing a programmable Structured ASIC, comprising the steps of:

laying out a Structured ASIC according to the steps of design entry, logic synthesis, system partitioning, floorplanning, placement and routing;

forming in the Structured ASIC a substantially rectangular shaped core;

inserting memory cells and logic cells formed of MOSFET transistors into the core:

inserting into the Structured ASIC a first IO comprising of IO blocks along sides of the core, operatively connected to the core, the first IO forming a first routing fabric;

inserting into the Structured ASIC a second IO comprising a high-speed routing fabric connected to the core; wherein, the second IO is faster in data transfer than the first IO, the second IO forming a second routing fabric, and the Structured ASIC is configured through via-configurable interconnections in the Structured ASIC;

forming the first routing fabric along the north-south, vertical sides of the core;

forming the second routing fabric along the east-west, horizontal sides of the core;

forming the core logic cells into a modular array having a plurality of logic cells arrayed in a repeating pattern module, the repeating pattern modular array comprising a plurality of flip-flops, logic cells and buffer cells, a clock macro and at least one full adder operative connected together;

forming the first routing fabric to connect the core to logical pin IO areas;

and, the memory cells and modular array aligned into alternating columns that lie along a vertical north-south direction to the core.

13. The method according to claim 12, further comprising the steps of:

inserting into the Structured ASIC a testing 10 comprising of IO blocks along the sides of the core, operatively connected to the core, the testing 10 comprising a test routing fabric operatively connected to the core memory cells; and inserting into the Structured ASIC a microcontroller block, operatively connected to the test routing fabric and forming a network with the test routing fabric and the core memory cells; and, inserting into the Structured ASIC a network bridge logic block for directing the data from the microcontroller to the core memory cells, so that the microcontroller can test the memory for errors.

14. The method according to claim 13, further comprising the steps of:

forming a clock bus operatively connected to the module array of the core logic cells and the first routing fabric;

placing a plurality of Digital Control Delay Lines operatively connected to the first routing fabric and to the clock bus, in order to delay any signal on the clock.

15. The method according to claim 13, further comprising the steps of:

placing PLL and DLL blocks in the first routing fabric; and, placing a plurality of Digital Control Delay Lines (DCDL) operatively connected to the first routing fabric and to the clock bus, in order to delay any signal on the clock and operatively connected to the first connection fabric, and, the DCDL and first routing fabric operatively connected to the modular array so that each modular array is abutting and adjacent to a plurality of DCDL lines.

16. The method according to claim 15, further comprising the steps of:

inserting into the Structured ASIC a block of electronic fuses to store memory addresses of the memory in the core that needs repair, after the microcontroller tests the memory;

inserting into the Structured ASIC circuitry connected to the core memory cells for repairing defective memories as ascertained by the microcontroller.

17. The method according to claim 15, further comprising the steps of:

inserting into the Structured ASIC a SerDes operative connected to the second routing fabric.

18. A Structured ASIC comprising:

means for switching forming logic cells and means for storing data forming memory cells, said logic cells and said memory cells forming a core region of the Structured ASIC;

a first means for input/output (IO) forming a first routing fabric connected to said core region, the first IO means comprising a plurality of IO blocks along the north-south vertical sides of the core, operatively connected to the core and to logical pin IO repeater areas;

a SerDes;

a second means for input/output (IO) forming a plurality of IO blocks comprising a high-speed routing fabric operatively connected to the core along the east-west horizontal sides of the core, and to said SerDes; wherein, the second IO is faster in data transfer than the first IO, and the Structured ASIC is configured through via-configurable interconnections in the Structured ASIC; and, the core region logic cells comprise a module array having a plurality of logic cell arrayed in a repeating pattern; the module array further comprising a plurality of flip-flops, a clock macro, full adders and buffer cells operatively connected, and, the memory cells and logic cells of the core region alternate and repeat in layout in columns along the vertical north-south direction to the core; and, a plurality of full adders for each module array, the full adders are placed external to the logic cells, and, the clock macro is placed in the centre of the module array, with the flip-flips and buffer cells forming a substantial cross-shape in the module array; and, a third means for input/output (IO) forming a test connection fabric operatively connected to the core memory cells;

a microcontroller, operatively connected to the test routing fabric means and forming a network with the test routing fabric and the core memory cells;

a network bridge logic block for directing the data from the microcontroller to the core memory cells; and, a block of electronic fuses to store memory addresses that need repair as ascertained by said microcontroller, and, circuitry connected to the core memory cells for repairing defective memories as ascertained by the microcontroller;

wherein the first IO means comprising a plurality of IO blocks is aligned next to the north-south, vertical sides of the core;

a fourth means for IO forming a second high-speed routing fabric, the fourth 10 means is faster in data transfer than the first IO, and disposed along a north-south vertical direction to the core; and, the area of the Structured ASIC is between 4.32 mm2 and 12.34 mm2 inclusive;

the number of logic cells in the Structured ASIC is between 84672 and 1774656 cells inclusive;

the number of full adders is between 42336 and 887328 inclusive;

the flip-flops are D flip-flops and the number of D flip-flops is between 58212 and 1220076 inclusive;

the memory cells are BRAM bit memory cells an range in size from 2.3 Mb to 55.7 Mb inclusive; and, the number of instances of BRAM range from 252 to 6004 instances, inclusive.

* * * * *